United States Patent
Katoh et al.

(10) Patent No.: US 6,380,764 B1
(45) Date of Patent: Apr. 30, 2002

(54) SEMICONDUCTOR INTEGRATED CIRCUIT DEVICE, RECORDING MEDIUM STORED WITH CELL LIBRARY, AND METHOD FOR DESIGNING SEMICONDUCTOR INTEGRATED CIRCUIT

(75) Inventors: Naoki Katoh, Kodaira; Kazuo Yano, Hino; Yohei Akita, Kokubunji; Mitsuru Hiraki, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/582,327
(22) PCT Filed: Dec. 16, 1998
(86) PCT No.: PCT/JP98/05688
§ 371 Date: Jun. 23, 2000
§ 102(e) Date: Jun. 23, 2000
(87) PCT Pub. No.: WO99/34512
PCT Pub. Date: Jul. 8, 1999

(30) Foreign Application Priority Data

Dec. 26, 1997 (JP) .............................................. 9-359277

(51) Int. Cl.[7] .............................................. H03K 19/00
(52) U.S. Cl. ........................... 326/93; 326/112; 326/95
(58) Field of Search .............................. 326/93, 95, 98, 326/112, 119, 121

(56) References Cited

U.S. PATENT DOCUMENTS 5,614,847 A * 3/1997 Kawahara et al. ............. 326/98
5,774,367 A    6/1998 Reyes et al.
6,118,309 A * 9/2000 Akamatsu et al. ........... 327/108
6,222,410 B1 * 4/2001 Seno ........................... 327/293

FOREIGN PATENT DOCUMENTS

JP          9-45785         2/1997

OTHER PUBLICATIONS

S. Mutoh et al, "1–V Power Suply High–Speed Digital Circuit Technology with Multithreshold–Voltage CMOS", IEEE Journal of Solid–State Circuit, vol. 30, No.8, Aug. 1995, pp. 847–854.

T. Sakata et al, "Subthreshold–Current Reduction Circuits for Multi–Gigabit Dram's", 1993 Symposium on VLSI Circuits Digest of Technical Papers May 1993, pp. 45–46.

* cited by examiner

Primary Examiner—Michael Tokar
Assistant Examiner—Anh Tran
(74) Attorney, Agent, or Firm—Mattingly, Stanger & Malur, PC.

(57) ABSTRACT

Disclosed is a semiconductor integrated circuit device constructed of MOSFETs in which there is attained a harmony between increase in consumption power due to a leakage current and operating speed of the MOSFETs in a suitable manner, and among a plurality of signal paths in the semiconductor integrated circuit device, a path which has a margin in delay is constructed with MOSFETs each with a high threshold voltage, while a path which has no margin in delay is constructed with MOSFETs each with a low threshold voltage which has a large leakage current but a high operating speed, in light of a delay with which a signal is transmitted along a signal path.

16 Claims, 18 Drawing Sheets

SEMICONDUCTOR INTEGRATED CIRCUIT DEVICE, RECORDING MEDIUM STORED WITH CELL LIBRARY, AND METHOD FOR DESIGNING SEMICONDUCTOR INTEGRATED CIRCUIT

BACKGROUND OF THE INVENTION

1. Field of the Invention

The present invention relates to a semiconductor integrated circuit device, particularly to a semiconductor integrated circuit device suitable for a high speed and low voltage operation, and a storage medium on which a cell library is stored.

2. Description of the Prior Art

There are widely used MOSFETs each having features of a high integration density and low consumption power, in semiconductor integrated circuit devices currently fabricated. A MOSFET has a threshold voltage by which ON-OFF characteristics of the FET are determined. In order to increase a drive ability and improve an operating speed in a circuit, there is a need for setting a threshold voltage to a low value.

However, when a threshold voltage is set to an excessively low value, there arise problems that an MOSFET cannot perfectly be turned off due to subthreshold characteristics (tailing characteristics) of the MOSFET, a subthreshold current (hereinafter "leakage current" is used) is increased and thereby consumption power is very large, as described in 1993 Symposium on VLSI Circuits Digest of Technical Papers, pp. 45–46 (May) 1993.

Generally, in order to increase a threshold voltage of a MOSFET, there have been employed methods in which a thicker gate oxide film is adopted or a higher impurity density is provided under a gate oxide film. In other words, in designing a semiconductor integrated circuit device which is constructed of MOSFETs, a desired operating frequency and consumption power are first considered and a threshold voltage is then determined, which is finally followed by determination of process conditions in semiconductor fabrication.

MOSFETs in a semiconductor integrated circuit device generally have a constant threshold voltage. According to an invention made in recent years, however, there has been proposed a semiconductor integrated circuit in which a substrate bias voltage is changed according to an operating state, standby or active, and thereby a threshold voltage of a MOSFET is controlled, as described in IEEE International Solid State Circuits Conference Digest of Technical Papers, pp. 166–167,1996.

According to the published Unexamined Japanese Patent Application No. Hei 8-274620, there has been proposed a technique that in the case where a semiconductor circuit is constructed with a plurality of functional blocks, a substrate bias voltage is independently selected in each functional block and a MOSFET with a low threshold voltage is provided in a block in whose operation a high speed is important, while a MOSFET with a high threshold voltage is provided in a block in whose operation a high speed is not important.

There has been a further proposal in IEEE Journal of Solid-State Circuit, Vol. 30, No. 8, pp.847–854, August 1995 that a power source supply line and a pseudo-power source supply line are provided in a circuit and a switching MOSFET is disposed therebetween, wherein a main circuit is supplied with a source voltage from the pseudo-power source supply line and in a standby state, the main circuit is not supplied with the source voltage by turning off the switching MOSFET, so that low consumption power is realized. In the article, there has also been proposed that the switching MOSFET has a higher threshold voltage as compared with MOSTETs constituting the main circuit in order that the switching MOSFET is kept the ON state in the active operating condition, while acting no switching.

As described above, there has been proposed in the prior art that a threshold voltage of a MOSFET is controlled by changing a substrate bias voltage according to operating states, standby or active; or a substrate bias voltage is independently selected in each functional block and a MOSFET with a low threshold voltage is provided in a block in whose operation a high speed is important, while a MOSFET with a high threshold voltage is provided in a block in whose operation a high speed is not important.

Besides, there has been proposed in the prior art that a high threshold voltage is used in a specific MOSFET for which a switching speed is not required in an operation. However, in the method that threshold voltages of MOSFETs are uniformly increased in a standby state and those are again uniformly decreased in an active operating state, increase in consumption power due to leakage current cannot be avoided in order to secure a high speed operation in the active operating state. Besides, the inventors of the present invention has discovered through a study conducted by them that there is actually present a case where a necessary operating speed is different in a different logic gate among logic gates even in the same functional block.

FIG. 11 shows a frequency distribution of delays in paths between flip-flops in a semiconductor integrated circuit operated at 100 MHz. The abscissa is used for plotting values of delays in paths and the ordinate is assigned to values of the number of paths respectively corresponding to the delay values. In order to operate at 100 MHz, a frequency distribution of delay values in the entire paths is necessary to be confined within a range less than a delay value of 10 nsec like the frequency distribution (1) shown in the figure. When an operating speed of the semiconductor integrated circuit is operated at 125 MHz, the entire paths has to fall in a frequency distribution less than a delay value of 8 nsec. To match such a condition, according to the prior art, there was two choices; one is to change process conditions and the other is to uniformly lower threshold voltages of MOSFETs constituting a circuit by changing a substrate bias source.

As a result, for example, a distribution of delay values is changed like the frequency distribution (2) of FIG. 11. In this case, however, consumption power by a leakage current is increased and there arises a risk that a required condition posed on consumption power is not met. Besides, in the case where consumption power is required to be further reduced, according to the prior art, there was again two choices; one is to change a process condition and the other is to uniformly increase threshold voltages of MOSFETs constituting a circuit by changing a substrate bias source. As a result, a distribution of delay values is changed like the frequency distribution (3), for example. That is, an operating speed is lowered and thereby 100 MHz cannot be realized.

Consequently, a compromise must be accepted determining whether an operating speed is attached with a grater importance or lower power consumption is chosen with priority.

SUMMARY OF THE INVENTION

It is an object of the present invention to solve the problems which the prior art has had. That is, it is an object of the present invention to provide a semiconductor integrated circuit device in which a harmony between increase in consumption power due to a leakage current and a operating speed is properly achieved, and thereby, not only is increase in consumption power by a leakage current of a MOSFET suppressed but a high speed operation is achievable in an active operation.

It is another object of the present invention to provide a storage medium on which there is stored a cell library necessary for designing a harmony between increase in consumption power due to a leakage current and a operating speed in a suitable manner.

It is a further object of the present invention to provide a designing method of a semiconductor integrated circuit device for designing a harmony between increase in consumption power due a leakage current and a operating speed in a suitable manner.

An essential point of the present invention for solving the above problems is to construct a semiconductor integrated circuit device using MOSFETs with different threshold voltages even in the same functional block in a given operating condition, for example in an active operating condition in which a high speed is required.

In particular, a first feature of a semiconductor integrated circuit device of the present invention is that the semiconductor integrated circuit device is constructed, in order to satisfy a requirement for an operating frequency, in such a manner that in a plurality of signal paths of the circuit, a path which has a margin in delay is constructed with MOSFETs each with a high threshold voltage in each of which an operating speed is low but a leakage current is small, whereas a path which has no margin in delay is constructed with MOSFETs each with a low threshold voltage in each of which a leakage current is large but an operating speed is high, in consideration of time, that is a delay, required for a signal to be transmitted along a signal path.

A second feature of a semiconductor integrated circuit device of the present invention is that when, in a signal path in the semiconductor integrated circuit device, if the path is constructed of only MOSFETs each with a high threshold voltage, a delay is large and a requirement for an operating frequency cannot be satisfied, but if the path is constructed of only MOSFETs each with a low threshold voltage, a margin arises in delay and consumption power due to a leakage current is uselessly increased, then MOSFETs each with a low threshold voltage and MOSFETs each with a high threshold voltage are mixed in a proper manner along the signal path and thereby, a delay which satisfies a requirement for an operating frequency is secured and at the same time a leakage current is suppressed to a minimum.

A third feature of a semiconductor integrated circuit device of the present invention is that in the case where, in the semiconductor integrated circuit device, when a construction in which a signal path from one starting node is branched at a node and then branches lead to a plurality of node contains a mixture of MOSFETs each with a low threshold voltage and MOSFETs each with a high threshold voltage in a proper manner as described above, more of MOSFETs each with a low threshold voltage are used along the path from the starting node to the branching node in order to minimize the use of MOSFETs each with a low threshold voltage in number, on the other hand, when a construction in which signal paths from a plurality of starting nodes are converged at a node and then a single signal path leads to one final node contains a mixture of MOSFETs each with a low threshold voltage and MOSFETs each with a high threshold voltage in a proper manner as described above, more of MOSFETs each with a low threshold voltage are used along the path from the converging node to the final node in order to minimize the use of MOSFETs each with a low threshold voltage in number.

First means for constructing a semiconductor integrated circuit with MOSFETs with different threshold voltages according to the present invention is that an impurity density of a semiconductor substrate under a gate oxide film of a MOSFET is changed, second means of the constructing the semiconductor integrated circuit is that a bias voltage value supplied to a substrate of the MOSFET is changed, third means is that a thickness of a gate oxide film of the MOSFET and fourth means is that a gate length of the MOSFET is changed.

A feature of the present invention is that MOSFETs with different threshold voltages are constructed with combinations of the four means.

A feature of the present invention is that, in the second means for constructing MOSFETs with different threshold voltages, a plurality of insular well regions which are insulated from each other are constructed in order to change a bias voltage value supplied to the substrate of a MOSFET and MOSFETs with different threshold voltages are disposed on different well regions.

A feature of the present invention is that, in order to dispose MOSFETs with different threshold voltages on different well regions, logic gates are arranged one dimensionally in one line and a plurality of rows of logic gates are arranged in directions perpendicular to the one line so as to dispose logic gates two dimensionally, wherein logic gates constituted of MOSFETs each with the same threshold voltage are arranged on the same row and MOSFETs each with the same threshold voltage are constructed on the same well region disposed along the row, and wherein a bias source is supplied by a wire in the same direction as that of a row.

A feature of the present invention is that when logic gates, which are constructed with MOSFETs each with the same threshold voltage, are arranged on one row and the logic gates are fabricated on the same well region disposed along the one row, a plurality of rows of logic gates which are arranged an adjacent manner to one another own commonly one well region among them if the plurality of logic gates are constructed with MOSFETs each with the same threshold voltage.

A feature of the present invention is that a storage medium on which there is stored a cell library used for designing the semiconductor integrated circuit is registered with at least two kinds of cell, which has the same function and the same size, but which are constructed with MOSFETs with different threshold voltages, and which, thereby, have different delays and different consumption power.

A feature of the present invention is that there is adopted a designing method for the semiconductor integrated circuit device which uses the storage medium on which the cell library is stored and comprises the steps of: calculating a delay of a signal path; and assigning to a logic circuit one cell selected among at least two kinds of cells constructed of switching elements, which have the same function and the same size, but which have different threshold voltages, using a calculation result by the step of calculating a delay of a signal path.

A feature of the present invention is that there is adopted another designing method for the semiconductor integrated circuit device which uses the storage medium on which the cell library is stored and comprises the steps of: designing a logic circuit using only cells constructed of switching elements each with a high threshold value; calculating a delay of a signal path; and replacing part of cells of the logic circuit designed using only cells constructed of switching elements each with a high threshold value by a cell constructed of switching elements each with low threshold value, each of which has the same function and the same size.

A feature of the present invention is that in application, a semiconductor integrated circuit comprises a signal path containing a plurality of circuits each of which holds a state of a signal, such as a latch circuit, a flip-flop circuit, a signal output terminal or a signal input terminal, wherein there are provided a plurality of transistors with different threshold values in paths between circuits. A feature of the present invention is that in application, a semiconductor integrated circuit comprises a plurality of first circuits controlled by a clock signal in a signal path and a second circuit including a plurality of transistors with different threshold values inserted between first circuits.

As a designing concept, a designing method of the present invention is a designing method for a semiconductor integrated circuit device in which a plurality of first circuits controlled by a clock signal are included in a signal path and a second circuit constructed of a plurality of transistors with different threshold values are inserted in paths between first circuits, wherein a threshold value of each of transistors constituting the second circuit is set so that a signal delay time between first circuits does not exceed a given target value.

That is, it is unavoidable that there exists a path which has the largest delay time, which determines an overall operating speed among paths between a plurality of first circuits. However, a delay time of the path can be smaller and an operating frequency of the entire circuit can in a proper manner be improved by using high speed transistors each with a low threshold value in such a path having a large delay time.

BRIEF DESCRIPTION OF THE DRAWINGS

These and other features, objects and advantages of the present invention will become apparent from the following description when taken in conjunction with the accompanying drawings wherein.

DESCRIPTION OF THE PREFERRED OF THE EMBODIMENTS

There will be described below embodiments of the present invention in reference to the accompanying drawings.

Figure 1:
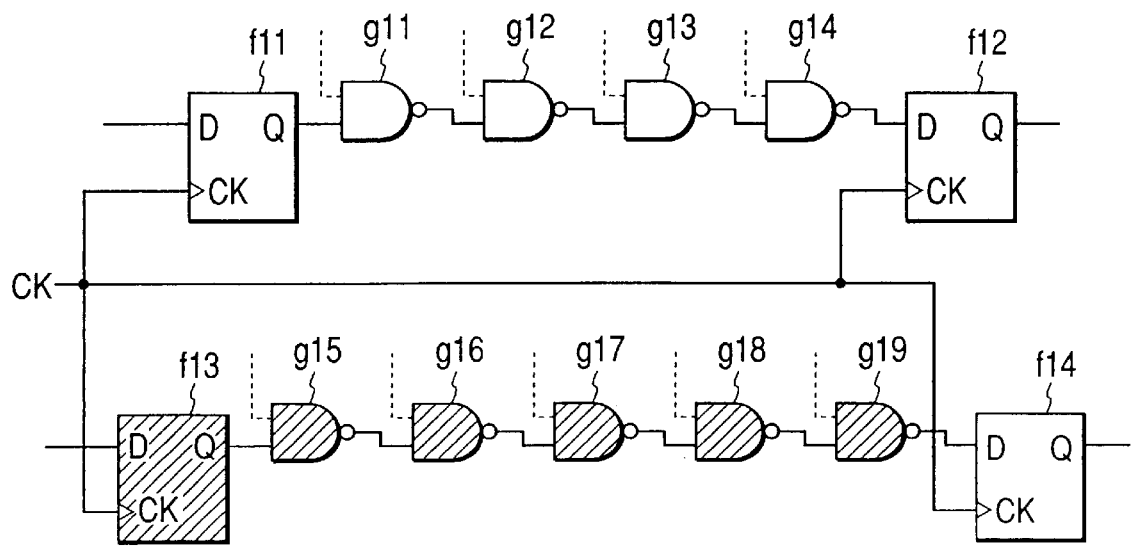
FIG. 1 is a diagram of a typical embodiment of a logic gate circuit in a semiconductor integrated circuit device of the present invention.

FIG. 1 is a diagram of a typical embodiment of the present invention. The circuit of FIG. 1 is constructed of flip-flops f11 to f14 and NAND elements g11 to g19. While the logic gates g11 to g19 are all shown as the NANDs for simplification of description, there is no limitation that a semiconductor integrated circuit device of the present invention is constructed of NAND elements only. There are omitted signals in the figure which have no relation with description. It is assumed in description that the circuit of an example of FIG. 1 is operated at 200 MHz. Therefore, it is a necessity that a delay in a path after a clock signal CK is input to the flip-flop f11 till the signal is input to the flip-flop f12 and a delay in a path after a clock signal CK is input to the flip-flop f13 till the signal is input to the flip-flop f14 are both within 5 nsec or less. Here, it is assumed that a delay when a NAND element and a flip-flop containing MOSFETs each with a high threshold voltage is 1 nsec and a delay when a NAND element and a flip-flop containing MOSFETs each with a low threshold voltage is 0.8 nsec.

In FIG. 1, the logic gates shown in half tone, that is f13, f15 to g19 contain MOSFETs each with a low threshold voltage and the elements shown in white contain MOSFETs each with a high threshold voltage. With such a structure, a delay in the path from f11 and g11 through g14 to f12 is 5 nsec and a delay in the path from f13 and g15 through g19 to f14 is 4.8 nsec, and both paths have delays equal to or less 5 nsec, which enables the circuit to operate at a target 200 MHz.

In this case, when all the logic gates are constructed with MOSFETs each with a high threshold voltage as in the prior art, a delay in the path from f13 and g15 through g19 to f14 is 6 nsec and therefore, this circuit can be operated only at 167 MHz.

Then, attention will be paid to a leakage current. Here, it is assumed that a leakage current of one logic gate is 1 pA when the circuit is constructed with MOSFETs each with a high threshold voltage while a leakage current of one logic gate is 5 pA when the circuit is constructed with MOSFETs each with a low threshold voltage. At this time, if a threshold voltage of MOSFETs constituting logic gates of a signal path is different from another signal path as in FIG. 1, the sum total of leakage currents amount to 37 pA. On the other hand, if threshold voltages of MOSFETs for the two paths are the same high threshold voltage as in the prior art, the sum total of leakage currents amount to 13 pA and if threshold voltages of MOSFETs for the two paths are the same low threshold voltage, the sum total of leakage currents amount to 65 pA.

In other words, while in the examples of the prior art of FIG. 1, the operating frequencies can only be chosen as 167 MHz at a leakage current in total of 13 pA or as 200 MHz at a leakage current in total of 65 pA, an operating frequency of 200 MHz can be realized at a total leakage current of 37 pA in paths according to the present invention. The essential feature of the embodiment shown in FIG. 1 is that MOSFETs each with a low threshold voltage and MOSFETs each with a high threshold voltage are selectively combined according to delays in paths constituting a semiconductor integrated circuit in order to suppress a leakage current while realizing a target operating frequency.

Figure 2:
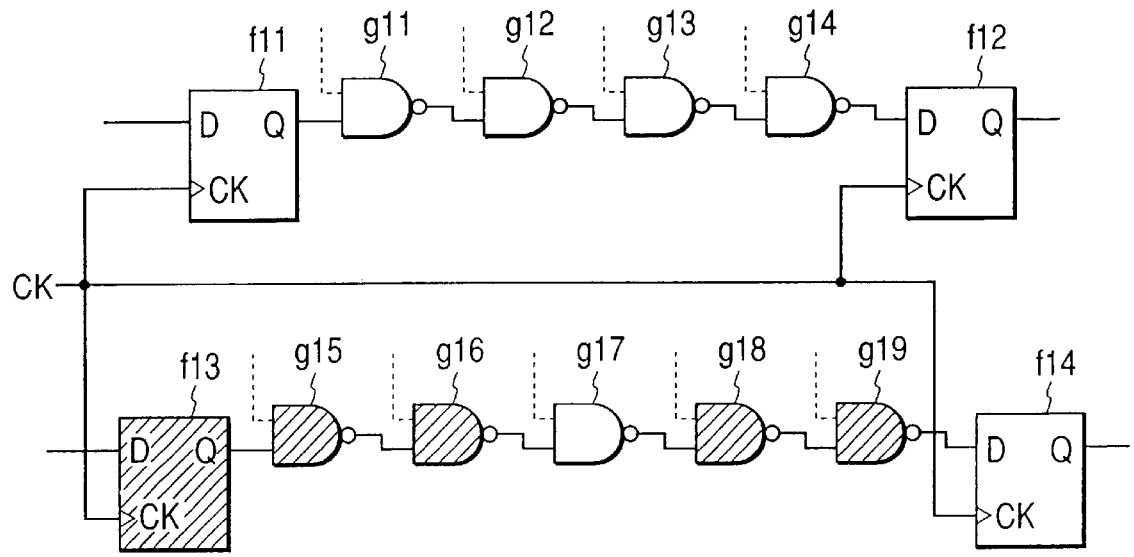
FIG. 2 is a diagram of a second embodiment of a logic gate circuit in a semiconductor integrated circuit device of the present invention.

A second embodiment of a logic gate circuit in a semiconductor integrated circuit device of the present invention will be shown using FIG. 2. The circuit of FIG. 2 is absolutely the same circuit as FIG. 1 but only with exception that a logic gate g17 of FIG. 2 is constructed with MOSFETs each with a high threshold voltage. In FIG. 1, all the logic gates along the path from f13 and g15 through g19 to f14 are constructed of MOSFETs each with a low threshold voltage and a delay is 4.8 nsec. It means that there is left a margin of 0.2 nsec in order to operate at an operating frequency. In the case of FIG. 2, when one element constructed of MOSFETs each with a high threshold voltage is mixed in a path from f13 and g15 through g19 to f14, too, a delay can be made to assume 5 nsec and a total leakage current can further be decreased to 33 pA. That is, an essential point of the embodiment shown in FIG. 2 is that MOSFETs with different threshold voltages are mixed in a proper manner even in one signal circuit in order to suppress a leakage current to a minimum which realizes a target operating frequency.

Figure 3:
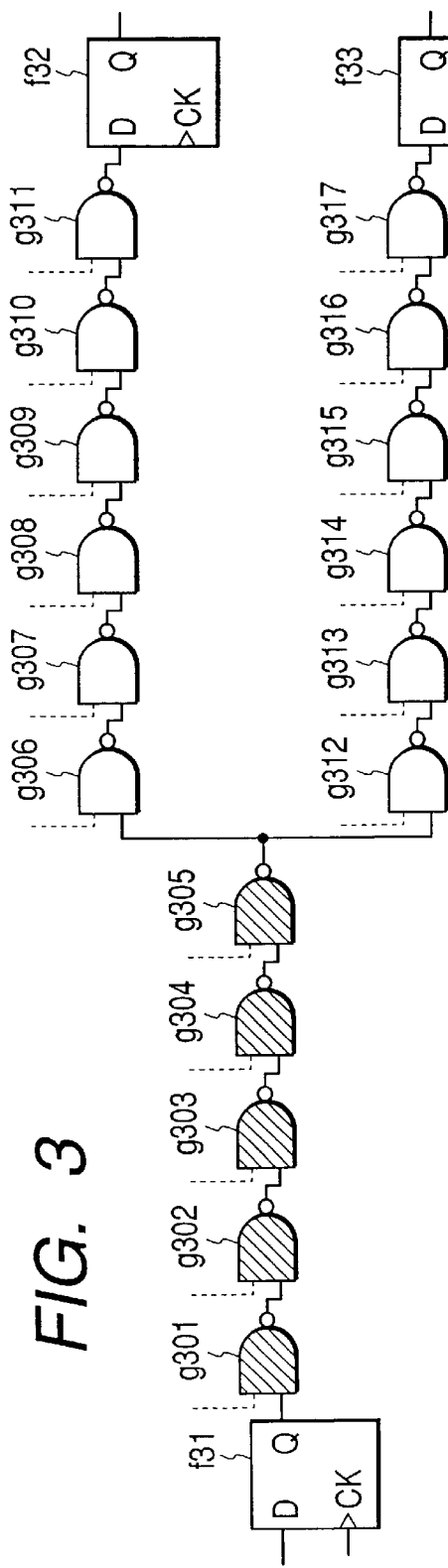
FIG. 3 is a diagram of a third embodiment of a logic gate circuit in a semiconductor integrated circuit device of the present invention.

A third embodiment of a logic gate circuit in a semiconductor integrated circuit device of the present invention is shown in FIG. 3. In FIG. 3, the circuit is constructed of flip-flops f31, f32, f33 and logic gates g301 to g317. It is assumed that target delays of the path f31 to f32 and the path f31 to f33 are both 10 nsec. Delays and a leakage current of each element is the same as those of FIGS. 1 and 2. Either of the path from f31 to f32 and the path f31 and f33 is constructed of eleven logic gates and there is a necessity that at least 5 elements among the eleven logic gates are constructed with MOSFETs each with a low threshold voltage in order to realize a delay of 10 nsec.

When a common portion on both paths from g301 to g305 is constructed with MOSFETs each with a low threshold as shown in FIG. 3, the number of logic gates constructed of MOSFETs each with a low threshold can be minimized in the whole circuit. In this case, a total leakage current is 37 pA. When logic gates other than those included in the common portion, for example logic gates g307 to g311 and logic gates g313 to g317 are constructed of MOSFETs each with a low threshold voltage, a total leakage current is 57 pA. When all the logic gates are constructed of MOSFETs each with a low threshold voltage as in the prior art, a total leakage current is 85 pA. An essential point of the embodiment shown in FIG. 3 is that in a circuit in which a signal path which starts from a node as one starting is branched at a node so that branches lead to a plurality of nodes, when MOSFETs each with a low threshold voltage and MOSFETs each with a high threshold voltage are mixed in a proper manner, more of MOSFETs each with a low threshold voltage are mixed in a path from the starting node to the branching node in order to minimize the use of MOSFETs each with a low threshold in number.

Figure 4:
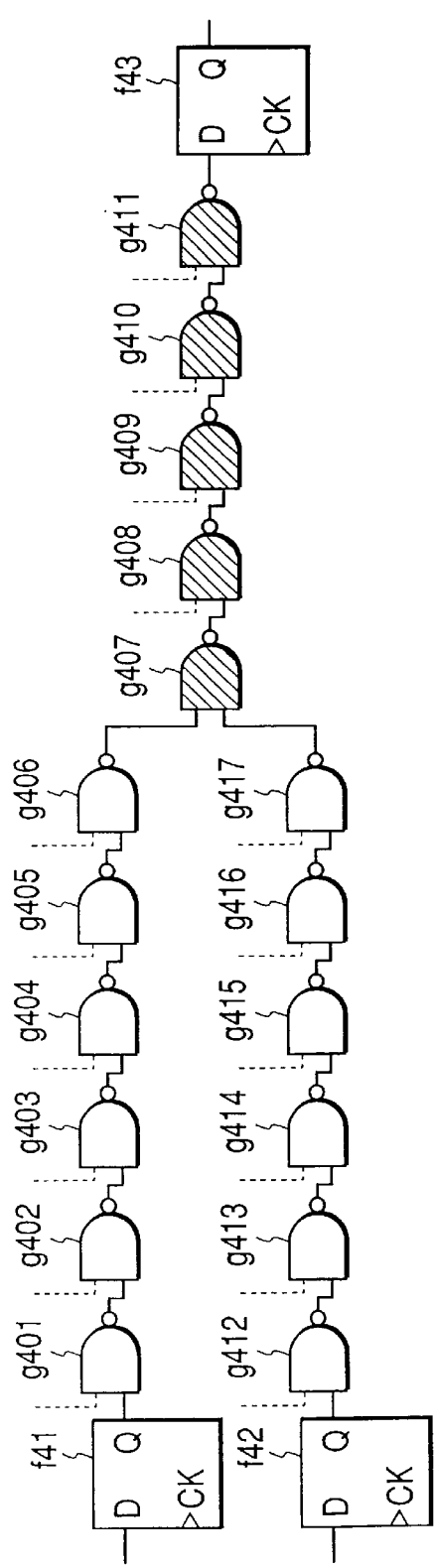
FIG. 4 is a diagram of a fourth embodiment of a logic gate circuit in a semiconductor integrated circuit device of the present invention.

A fourth embodiment of a logic gate circuit in a semiconductor integrated circuit device of the present invention is shown using FIG. 4. FIG. 4 is constructed of flip-flops f41, f42, f43 and logic gates g401 to g417. Target delays of a path from f41 to f43 and a path from f42 to f43 are both 10 nsec as in FIG. 3. Delays and leakage current of respective elements are same as those in FIGS. 1 to 3. Either of the path extending from f41 to f43 and the path extending from f42 to f43 contains eleven logic gates and there is a necessity that at least five elements among the eleven logic gates have to be constructed of MOSFETs each with a low threshold voltage in order to realize a delay of 10 nsec.

When the common portion of both paths f407 to g411, as shown in FIG. 4, is constructed of MOSFETs each with a low threshold voltage, the number of logic gates constructed of MOSFETs each with a low threshold voltage is minimized in the whole circuit. In this case, a total current is 37 pA. When logic gates other than those in the common portion, for example, logic gates g401 to g405 and g412 to g416 are constructed of MOSFETs each with a low threshold voltage, a total leakage current is 57 pA. When all the logic gates are constructed of MOSFETs each with a low threshold voltage as in the prior art, a total leakage current is 85 pA. That is, an essential point of the embodiment shown in FIG. 4 is that in a circuit in which signal paths from a plurality of nodes as starting points are converged so that one converged path leads to one node, when MOSFETs each with a low threshold voltage and MOSFETs each with a high threshold voltage are mixed with each other in a proper manner, MOSFETs each with a low threshold voltage for use in the common portion from the converged node to the final node are more in ratio than those for use in the other paths, in order to minimize the number of MOSFETs each with a low threshold voltage for use.

Figure 19:
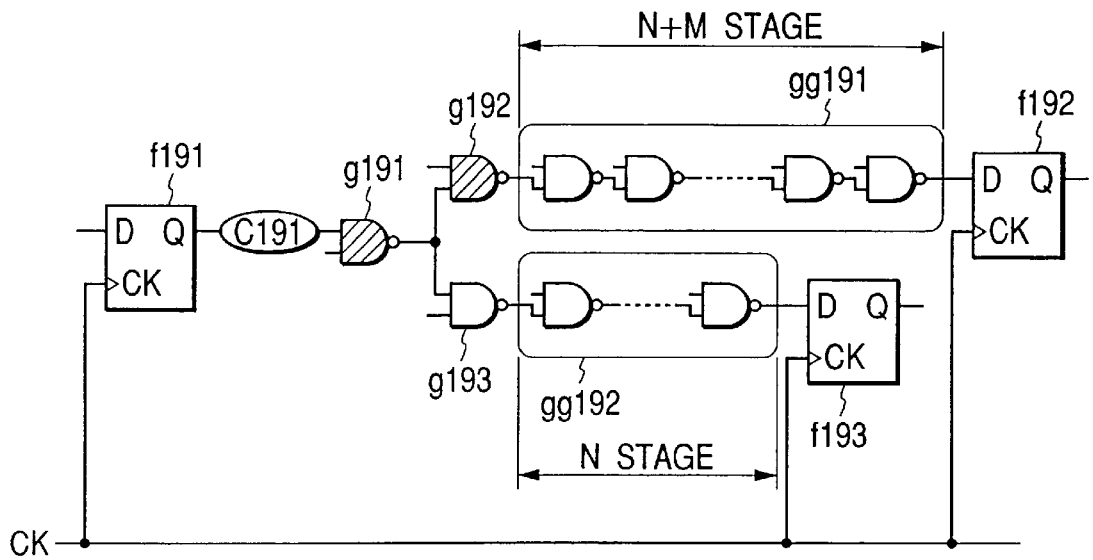
FIG. 19 is a diagram of a fifth embodiment of a logic gate circuit in a semiconductor integrated circuit of the present invention.

A fifth embodiment of a logic gate circuit in a semiconductor integrated circuit device of the present invention will be described using FIG. 19. FIG. 19 is the embodiment comprising: a first signal path containing a flip-flop f191 as a start, through a circuit c191 constructed of one or plural logic gates, a logic gate g191, a logic gate g192 and a logic gate group gg191, and finally a flip-flop f192 and a second signal path containing a flip-flop f191 as a start, through a circuit c191 constructed of one or plural logic gates, a logic gate g191, a logic gate g193 and a logic gate group gg192, and finally a flip-flop f193. It is assumed that if both paths are uniformly constructed of only MOSFETs each with a high threshold voltage, delays of both paths exceed a target delay.

It has been described that in this case, the common logic gate g191 is constructed of MOSFETs each with a low threshold voltage. Attention will be paid to the logic gate groups gg191, gg192. The logic gate group gg192 comprises logic gates of a N stage structure and the logic gate group gg191 comprises logic gates of a N+M stage structure which is more than gg192, that is the logic gates of a N stage structure, by M stages of logic gates. In this condition, the first signal path including the logic gate group gg191 has a larger delay than the second signal path including the logic gate group gg192. In such a case, the logic gate g192, which is fanned out by the logic gate g191 which is constructed of MOSFETs each with a low threshold voltage, is constructed of MOSFETs each with a low threshold voltage. Some logic gates of the logic gate group gg191 are constructed of MOSFETs each with a low threshold voltage as needed, which is not shown.

Figure 20:
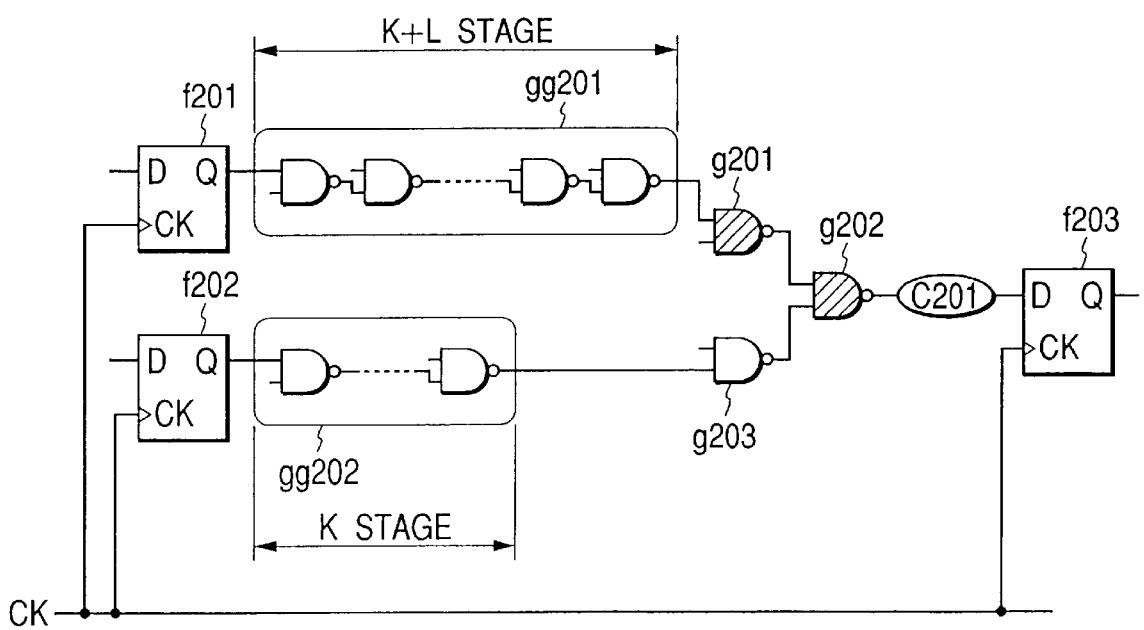
FIG. 20 is a diagram of a sixth embodiment of a logic gate circuit in a semiconductor integrated circuit of the present invention.

A sixth embodiment of a logic gate circuit in a semiconductor integrated circuit device of the present invention will be described using FIG. 20. The embodiment of FIG. 20 comprises: a first signal path containing a flip-flop f201 as a start, through a logic gate group gg201, a logic gate g201, a logic gate g202 and a circuit c201 constructed of one or plural logic gates, and finally a flip-flop f203 and a second signal path containing a flip-flop f202 as a start, through a logic gate group gg202, a logic gate g203, a logic gate g202 and a circuit c201 constructed of one or plural logic gates, and finally a flip-flop f203. It is assumed that if both paths are constructed of only MOSFETs each with a uniform high threshold voltage, delays of both paths exceed a target delay.

It has been described that in this case, the common logic gate g202 is constructed of MOSFETs each with a low threshold voltage. Attention will be paid to the logic gate groups gg201, gg202. The logic gate group gg202 comprises logic gates of a K stage structure and the logic gate group gg201 comprises logic gates of a K+L stage structure which is more than gg202, that is the logic gates of a K stage structure, by L stages of logic gates. In this condition, the first signal path including the logic gate group gg201 has a larger delay than the second signal path including the logic gate group gg202. In such a case, the logic gate g201 of the first path is constructed of MOSFETs each with a low threshold voltage. Some logic gates of the logic gate group gg201 are constructed of MOSFETs each with a low threshold voltage as needed, which is not shown.

Figure 12:
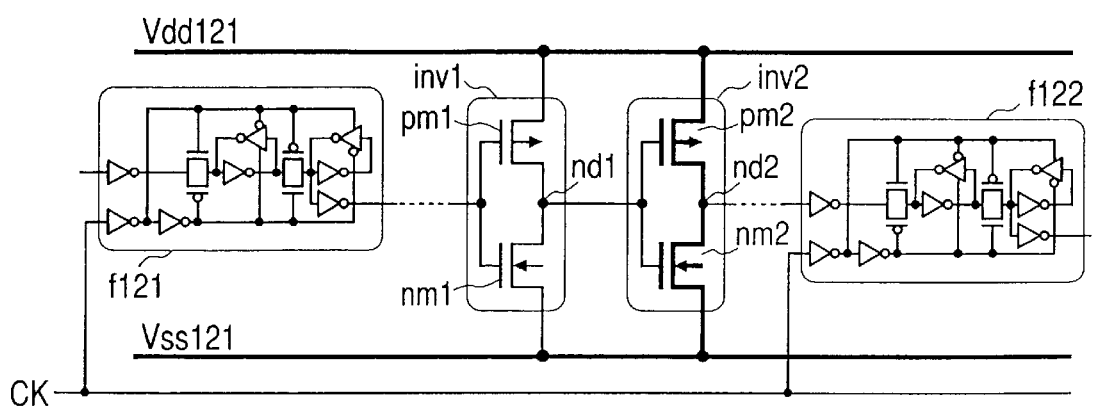
FIG. 12 is a diagram of an embodiment of a MOSFET circuit in a semiconductor integrated circuit device of the present invention.

In FIG. 12, there will be described an embodiment using a complementary MOSFET constructed of a p-channel MOSFET and an n-channel MOSFET. An output pin of a flip-flop f121 is connected with a gate of a first p-channel MOSFET pm1 and a gate electrode of a first n-channel MOSFET nm1 through one or plural MOSFETs. The p-channel MOSFET pm1 is connected with a first operating potential supply line Vdd121 and a first node nd1 so that a source/drain path lies therebetween and the n channel MOSFET nm1 is connected with first node nd1 and the second operating potential supply line Vss121 so that a source/drain path lies therebetween.

The first node nd1 is in turn connected with a gate of a second p-channel MOSFET pm2 and a gate electrode of a second n-channel MOSFET nm2. The p-channel MOSFET pm2 is connected with the first operating potential supply line Vdd121 and a second node nd2 so that a source/drain path lies therebetween, and the n-channel MOSFET nm2 is connected with the second node nd2 and a second operating potential supply line Vss121 so that a source/drain path lies therebetween. Besides, the second node nd2 is connected to an input pin of a second flip-flop f122 through one or plural MOSFETs.

In the interior of the flip-flops f121, f122 of the figure, an inverter, a tristate gate, transfer gate and the like are shown by logic gate symbols. A clock signal CK is input to the flip-flops f121, f122. In the figure, a thin solid line is used for drawing a MOSFET each with a high threshold voltage and a thick solid line is used for drawing a MOSFET each with a low threshold voltage. Hereinafter, such notation will be used through the end of description.

In FIG. 12, the p-channel MOSFET pm2 and the n-channel MOSFET nm2 are MOSFETs each with a low threshold voltage, and the p-channel MOSFET pm1 and the n-channel MOSFET nm1 are MOSFETs each with a high threshold voltage. As enclosed with frames, the p-channel MOSFET pm1 and the n-channel mosfet nm1 constitutes an inverter logic gate inv1 and the p-channel MOSFET pm2 and the n-channel MOSFET nm2 constitutes an inverter logic gate inv2. In the circuit, a time length, in which a clock signal CK is input to the flip-flop f121, a signal is output from an output pin of the flip-flop f121 and then the signal reaches an input pin of the flip-flop f122 through the inverters inv1, inv2, that is a delay of the path, is necessary to be within a one cycle of a clock signal CK.

While additional consideration, actually, has to be given to a time required for set-up of flip-flop, deviation in time for a signal to reach the flip-flop and the like. Here, such circumstances are neglected because of no relevancy to essence to description. That is, A delay of the path is the sum of a delay in the course in which a clock signal is input in the flip-flop f121 and an signal is output from the flip-flop f121, a delay in the inverter inv1 and a delay in the inverter inv2. Here, it is assumed that when the p-channel MOSFET pm1, the n-channel MOSFET nm1, the p-channel MOSFET pm2 and the n-channel MOSFET nm2 all are of MOSFETs each with a high threshold voltage, the delay of the path is longer than one clock cycle, while when all the MOSFETs are of MOSFETs each with a low threshold voltage, the delay of the path has a margin as compared to a clock cycle (that is, useless power is consumed).

While in such a manner, according to the prior art, a delay and consumption power have not been optimized so as to be on balance, when the p-channel MOSFET pm2 and the n-channel MOSFET nm2 only are made to be constructed with a low voltage threshold as in the embodiment, a delay is adjusted to be met the requirement and in addition consumption power can be suppressed.

Figure 13:
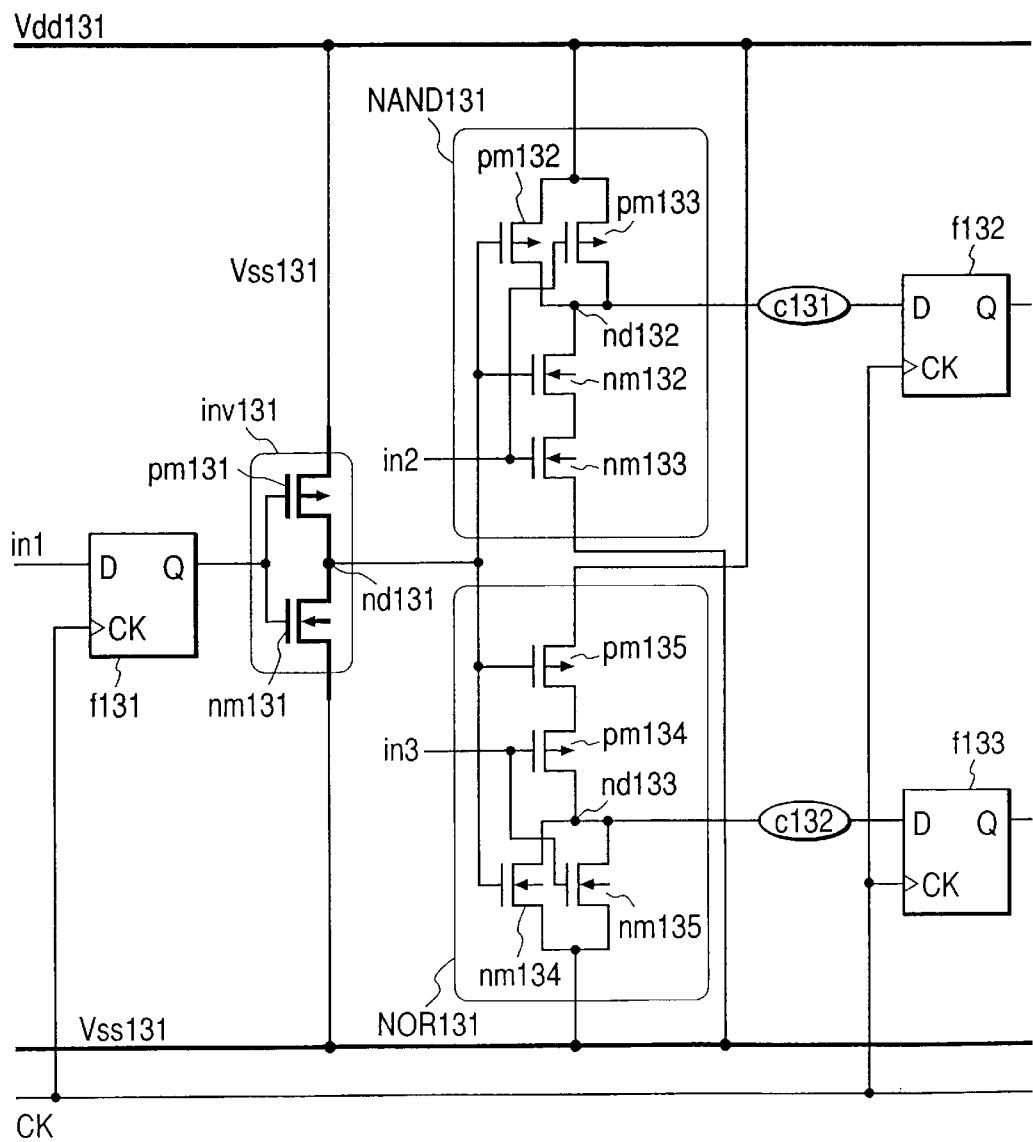
FIG. 13 is a diagram of a second embodiment of a MOSFET circuit in a semiconductor integrated circuit device of the present invention.

In FIG. 13, there will be described a second embodiment using a complementary MOSFET constructed of a p-channel MOSFET and an n-channel MOSFET. An output pin of a flip-flop f 131 is connected to a gate of a first p-channel MOSFET pm131 and a gate electrode of a first n-channel MOSFET nm131.

The p-channel MOSFET pm131 is connected with a first operating potential supply line Vdd131 and a first node nd131 so that a source/drain path lies therebetween and the n-channel MOSFET nm131 is connected with the first node nd131 and a second operating potential supply line Vss131 so that a source/drain lies therebetween. Besides the first node nd131 is connected with a gate of a second p-channel MOSFET pm132, gates of a second n-channel MOSFET nm132 and a third p-channel MOSFET pm134, and a gate of a third n-channel MOSFET nm134.

The p-channel MOSFET pm132 is connected with the first operating potential supply line Vdd131 and a second node nd132 so that a source/drain path lies therebetween and a fourth p-channel MOSFET pm133 is also connected with the first operating potential line Vdd131 and the second node 132 so that a source/drain path lies therebetween. The second n-channel MOSFET nm132 and the fourth n-channel MOSFET nm133 are in series connected between the second node nd132 and the second operating potential supply line Vss131 so that source/drain paths lie therebetween.

The third p-channel MOSFET pnm134 and a fifth p-channel MOSFET pm135 are in series connected between the first operating potential supply line Vdd131 and a third node nd133 so that a source/drain paths lie therebetween. The second n-channel MOSFET nm132 is connected with the third nod nd133 and the second operating potential supply line Vss131 so that a source/drain path lies therebetween. Like this, a fifth n-channel MOSFET nm135 is also connected with the third node nd133 and the second operating potential line Vss131 so that a source/drain path lies therebetween.

Besides, the second node nd132 is connected with an input pin of a second flip-flop f132 through a circuit c131 constructed of one or plural logic gates (in the figure, shown as an ellipse as a symbol). The third node nd133 is connected with an input pin of a third flip-flop f133 through a circuit c132 constructed of one or plural logic gates (shown as an ellipse like c131).

In the figure, gates inside a flip-flop is omitted. A clock signal CK is input to a flip-flop. As enclosed by a frame, the p-channel MOSFET pm131 and the n-channel MOSFET nm131 constitutes an inverter logic gate inv131; the p-channel MOSFETs pm132, pm133 and the n-channel MOSFETs nm132, nm133 constitute a NAND logic gate NAND131; and the p-channel MOSFETs pm134, pm135 and the n-channel MOSFETs nm134, nm135 constitute a NOR logic gate NOR131. A signal in2 is input to the NAND131 in addition to an output of the inv131 and a signal in3 is input to the NOR131 in addition to an output inv131.

In the circuit, there are necessities that a time length after a clock signal CK is input to the flip-flop f131 till a signal output from an output pin of the flip-flop f131 reaches an input pin of the flip-flop 132 through the inverter inv131 and the NAND131, and further through the c131; and a time length after a signal is output from the output pin of the flip-flop f131 till the signal reaches an input pin of the flip-flop 133 through the inverter inv131 and the NOR131, and further through the c132 are within a cycle of the clock signal CK. In the embodiment, too, it is assumed that when MOSFETs constituting the NAND131, the NOR131 and the inv131 are all of MOSFETs each with a high threshold voltage, each of delays of the two paths is larger than a clock cycle, while when MOSFETs constituting the NAND131, the NOR131 and the inv131 are all made of MOSFETs each with a low threshold voltage, the delay of the path has a margin as compared to a clock cycle (that is, useless power is consumed).

While in the embodiment of FIG. 12, no difference in consumption power arises between when the inv1 is constructed of MOSFETs each with a low threshold and when the inv2 is constructed with MOSFETs each with a low threshold, in the case where the path is branched at the node nd131 as in the embodiment, the MOSFETs pm131 and nm131 of the logic gate upstream from the branch node nd131, that is commonly owned by both paths, are made of MOSFETs each with a low threshold voltage. Thereby, there is minimized the number of MOSFETs each with a low threshold which are required for confining delays within a target time length and besides, it is possible to suppress consumption power more. While in the embodiment, the case where a path is branched to two paths is described, the cases where a path is branched to three paths or more, that is the fan-out is 3 or more, are included in the scope of the present invention and the same effects and actions as the case of the two branched paths can be attained.

Figure 14:
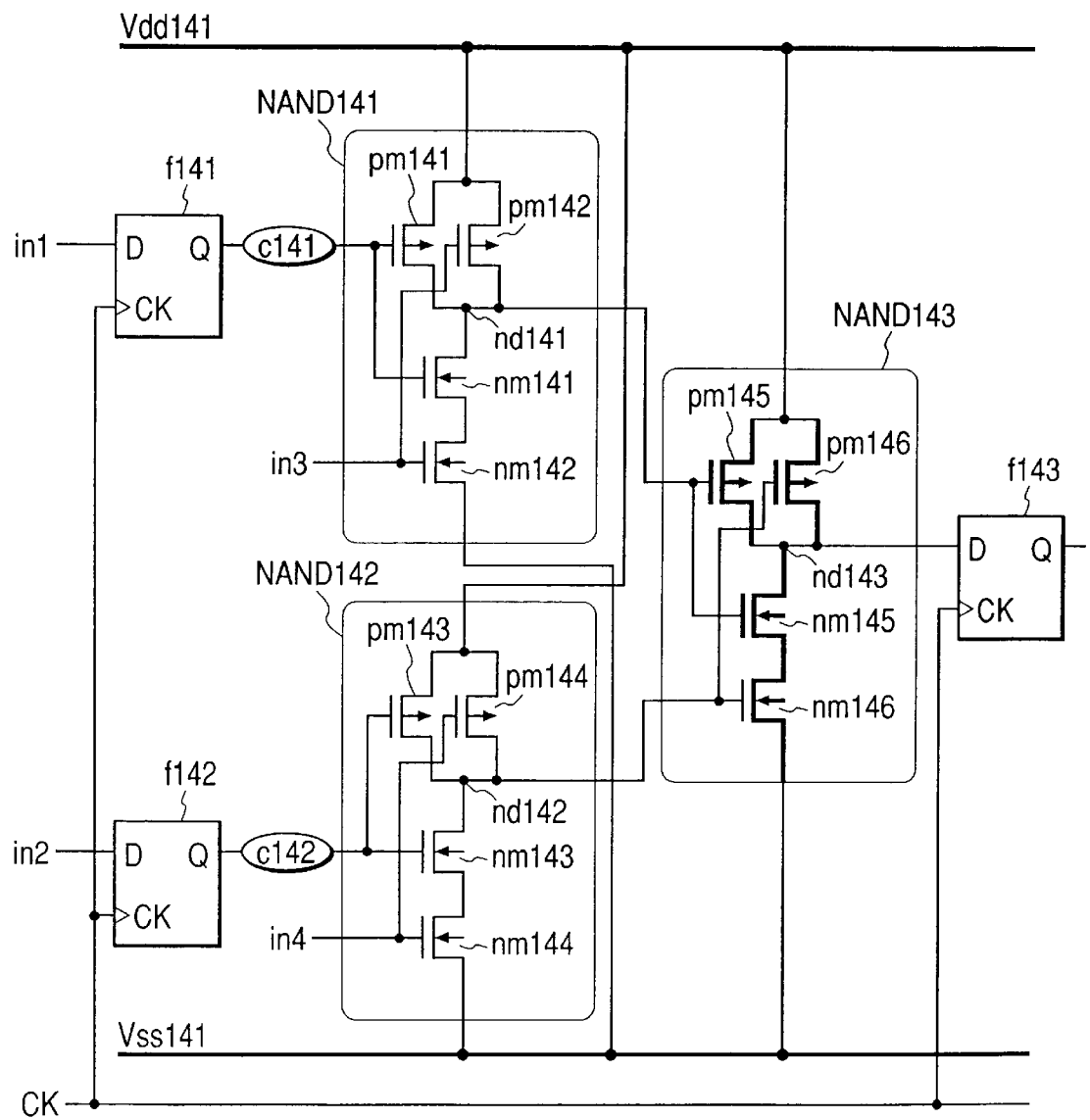
FIG. 14 is a diagram of a third embodiment of a MOSFET circuit in a semiconductor integrated circuit device of the present invention.

In FIG. 14, there will be described a third embodiment using a complementary MOSFET constructed of a p-channel MOSFET and an n-channel MOSFET. An output pin of a flip-flop f141 is connected to gate electrodes of a first p-channel MOSFET pm141 and a first n-channel MOSFET nm141 through a logic gate circuit c141. The p-channel MOSFET pm141 is connected to a first operating potential supply line Vdd141 and a first node nd141 so that a source/drain path lies therebetween. A second p-channel MOSFET pm142 is also connected to the first operating potential supply line Vdd141 and the first node nd141 so that a source/drain path lies therebetween. The n-channel MOSFET nm141and a second n-channel MOSFET nm142 are in series connected with the first node nd141 and a second operating potential supply line Vss141 so that source/drain paths lie therebetween.

An output pin of a flip-flop f142 is connected to gate electrodes of a third p-channel MOSFET pm143 and a third n-channel MOSFET nm143 through a logic gate circuit c142. The p-channel MOSFET pm143 is connected with the first operating potential supply line vdd141 and a second node nd142 so that a source/drain path lies therebetween. A fourth p-channel MOSFET pm144 is also connected with the first operating potential supply line Vdd141 and the second node nd142 so that a source/drain path lies therebetween. The n-channel MOSFET nm143 and a fourth n-channel MOSFET nm144 are in series connected with the second node nd142 and a second operating potential supply line Vss141 so that source/drain paths lie therebetween.

Besides, the first node nd141 is connected with gate electrodes of a fifth p-channel MOSFET pm145 and a fifth p-channel MOSFET nm145. Furthermore, the second node nd142 is connected with gate electrodes of a sixth p-channel MOSFET pm146 and a sixth n-channel MOSFET nm146.

The p-channel MOSFETs pm145, pm146 are connected with the first operating potential supply line Vdd141 and a third node nd143 so that source/drain paths lie therebetween and the n-channel MOSFET nm145 and the n-channel MOSFET nm146 are in series connected with the third node nd143 and the second operating potential supply line Vss141 so that source/drain paths lie therebetween. Besides, the third node nd143 is connected with an input pin of a third flip-flop f143. In the figure, as well, gates inside the flip-flip are omitted. A clock signal is input to the flip-flop. As enclosed by a frame, the p-channel MOSFETs pm141, pm142 and the n-channel MOSFETs nm141, nm142 constitute a NAND logic gate NAND141 and the p-channel MOSFETs pm143, pm144 and the n-channel MOSFETs nm143, nm144 constitute a NAND logic gate NAND142 and the p-channel MOSFETs pm145, pm146 and the n-channel MOSFETs nm145, nm146 constitute a NAND logic gate NAND143.

In the circuit, there are necessity that a time length after a clock signal CK is input to the flip-flop f141 till a signal output from an output pin of the flip-flop f141 reaches an input pin of the flip-flop 143 through c141, the NAND141 and the NAND143; and a time length after a signal is output from the output pin of the flip-flop f142 and a CK signal is input the flip-flop f142 till a signal output from an output pin of the flip-flop f142 reaches the input pin of a flip-flop f143 through c142, the NAND 142 and further the NAND 143 are within a cycle of the clock signal CK.

It is assumed that when all MOSFETs constituting the NAND141, the NAND142 and the NAND143 are made of MOSFETs each with a high threshold voltage even in the embodiment, delays of the above described two paths are larger than a clock cycle, while when all the MOSFETs are made of MOSFETs each with a low threshold, the delay of the path has a margin as compared to a clock cycle (that is, useless power is consumed). While in the embodiment of FIG. 12, no difference in power consumption arises between when the inv1 is constructed of MOSFETs each with a low threshold and when the inv2 is constructed with MOSFETs each with a low threshold, in the case where the paths from the two inputs converge as in the embodiment, the MOSFETs of the logic gate commonly owned by both paths, are constructed of MOSFETs each with a low threshold voltage with a higher priority over the others as described in FIG. 13. That is, in the figure, the pm145, pm146 and nm145, nm146 are constructed of MOSFETs each with a low threshold voltage. Therefore, there is minimized the number of MOSFETs each with a low threshold which are required for confining delays within a target time length and besides, it is possible to suppress consumption power more. While in the embodiment, the case where two paths converged is described, the cases where three paths or more are converged are included in the scope of the present invention and the same effects and actions as the case of the two paths are converged can be attained.

Figure 21:
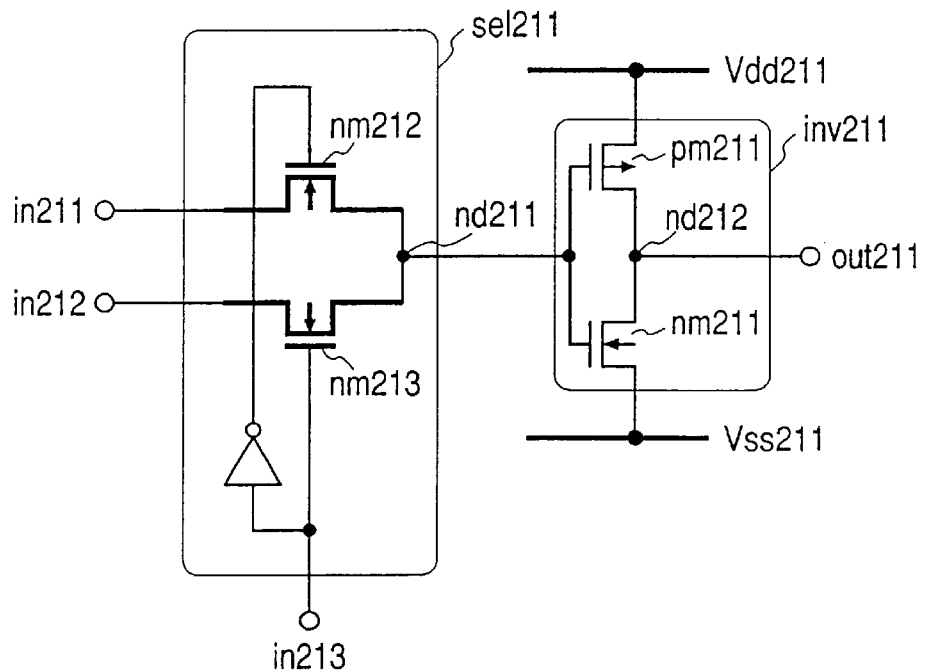
FIG. 21 is a diagram of an embodiment of a MOSFET circuit in which a pass transistor and a complementary MOSFET are mixed in a semiconductor integrated circuit device of the present invention.

In FIG. 21, an embodiment of the present invention using a pass transistor gate made of an n-channel MOSFET and a complementary MOSFET constructed of a p-channel MOSFET and an n-channel MOSFET and an n-channel MOSFET.

An input signal in211 is input to a drain electrode of a first n-channel MOSFET nm212; an input signal in212 is input in a drain electrode of a second n-channel MOSFET nm213; besides, an input signal in213 is input to a gate electrode of the second n-channel MOSFET nm213; and negation of the input signal in213 is input to a gate electrode of the first n-channel MOSFET nm212. Source electrodes of the first n-channel MOSFET nm212 and the second n-channel MOSFET nm213 are connected with a first node nd211, and the first n-channel MOSFET nm212 and the second n-channel MOSFET nm213, both as pass transistors, constitute a selector logic gate se1211 with two inputs/one output.

Besides, the first node nd211 is connected to gate electrodes of a first p-channel MOSFET pm211 and a third n-channel MOSFET nm211. The first p-channel MOSFET pm211 is connected with a first operating potential supply line Vdd211 and a second node nd212 so that a source/drain path lies therebetween and the third n-channel MOSFET nm211 is connected with a second operating potential supply line Vss211 and the second node nd212 so that a source/drain lies therebetween. Thereby, an inverter logic gate inv211 is constructed with the first p-channel MOSFET pm211 and the third n-channel MOSFET nm211. The circuit shown in FIG. 21 is a circuit in which a pass transistor logic gate and a complementary MOSFET logic gate is mixed.

In this case, the first and second n-channel MOSFET nm212, nm213, which are pass transistors, are constructed of MOSFETs each with a low threshold voltage. Since a logic gate can be formed by a pass transistor in a compact manner, the pass transistor has attracted public attention in recent years, but the inventors have discovered a problematic issue that reduction in switching speed of a pass transistor in low voltage operation is conspicuous as compared with a complementary MOSFET. Therefore, as in the embodiment, the inventors have been able to solve the problem by using a pass transistor with a low threshold voltage in a semiconductor integrated circuit in which a complementary MOSFET and a pass transistor are mixed, and thus a low voltage and high speed operation have been possible in a semiconductor integrated circuit in which a complementary MOSFET and a pass transistor are mixed with each other without decrease in operating speed of the pass transistor.

Then, there will be described an embodiment of means to realized MOSFETs with different threshold voltages. A first means to construct a semiconductor integrated circuit of MOSFETs with different threshold voltages is to change a impurity density of a semiconductor substrate under a gate oxide film of a MOSFET.

Figure 15:
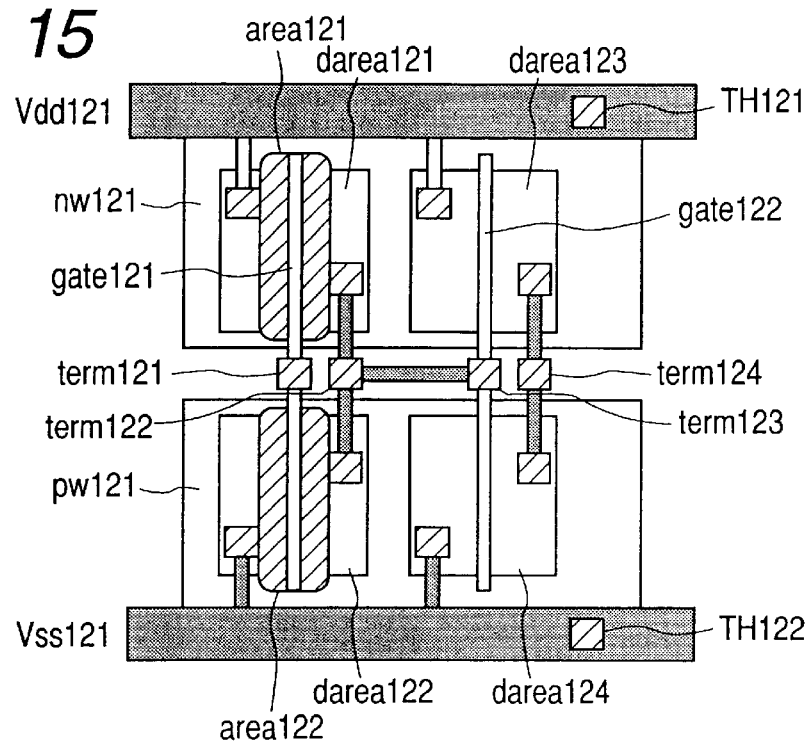
FIG. 15 is a diagram of an embodiment of a layout of a semiconductor integrated circuit device of the present invention.

FIG. 15 shows an embodiment of a layout of the circuit of FIG. 12 in which the above described method is employed. In FIG. 15, the flip-flops f121, f122 are omitted. An output pin of the flip-flop f121 is connected to term121. The term121 is connected to a first gate electrode gate121. The gate electrode gate121 passes over a $p^+$ source/drain region darea121 and thereby a first p-channel MOSFET pm1 is formed, while the gate electrode gate121 passes over $n^+$ source/drain region darea122 and thereby a first n channel MOSFET nm1 is formed. The $p^+$ source/drain region darea121 is formed on an n well region nw121 and the $n^+$ source/drain region darea122 is formed on a p well region pw121.

A source of the p channel MOSFET pm1 is connected to a first operating potential supply line Vdd121 and a drain is connected to a drain of the n channel MOSFET nm1 and a terminal term122. A source of the n channel MOSFET nm1 is connected a second operating voltage supply line Vss121. A black square in the figure shows a through hole through which interconnection is effected between a different metal interconnect layer and a semiconductor substrate. Electricity is supplied to the n well region nm121 from the Vdd121 through a through hole TH121 and electricity is also supplied to the p well region pw121 from the Vss121 through a through hole TH122.

Thus, the inverter logic gate inv1 of FIG. 2 is formed. The first inverter logic gate inv1 is formed with the first p channel MOSFET pm1 and the first n channel MOSFET nm1. Likewise, the second p channel MOSFET pm2 and the second n channel MOSFET nm2 are formed with a second gate electrode 122, a $p^+$ source/drain region darea123 and an $n^+$ source/drain region darea124. The second inverter logic gate inv2 is formed with the second p channel MOSFET pm2 and the second n channel MOSFET nm2. An output terminal term122 of the inv1 and an input terminal term123 of the inv2 are connected to each other and thus the circuit with two inverters shown in FIG. 12 is formed.

An output terminal term124 of the inv2 is connected with an input pin of the second flip-flop f122. Here, regions area121, area122 which are hatched are shown under the first gate electrode gate121. In a fabrication process of a semiconductor integrated circuit, an impurity is distributed in the well regions pw121, nw121 as shallow layers, thereafter, again an impurity is additionally distributed only in the regions area121, area122 in a selective manner and thereby impurity densities in the regions only are increased, which enables only each of MOSFETs pm1, nm1 to have a high threshold voltage.

Figure 5:
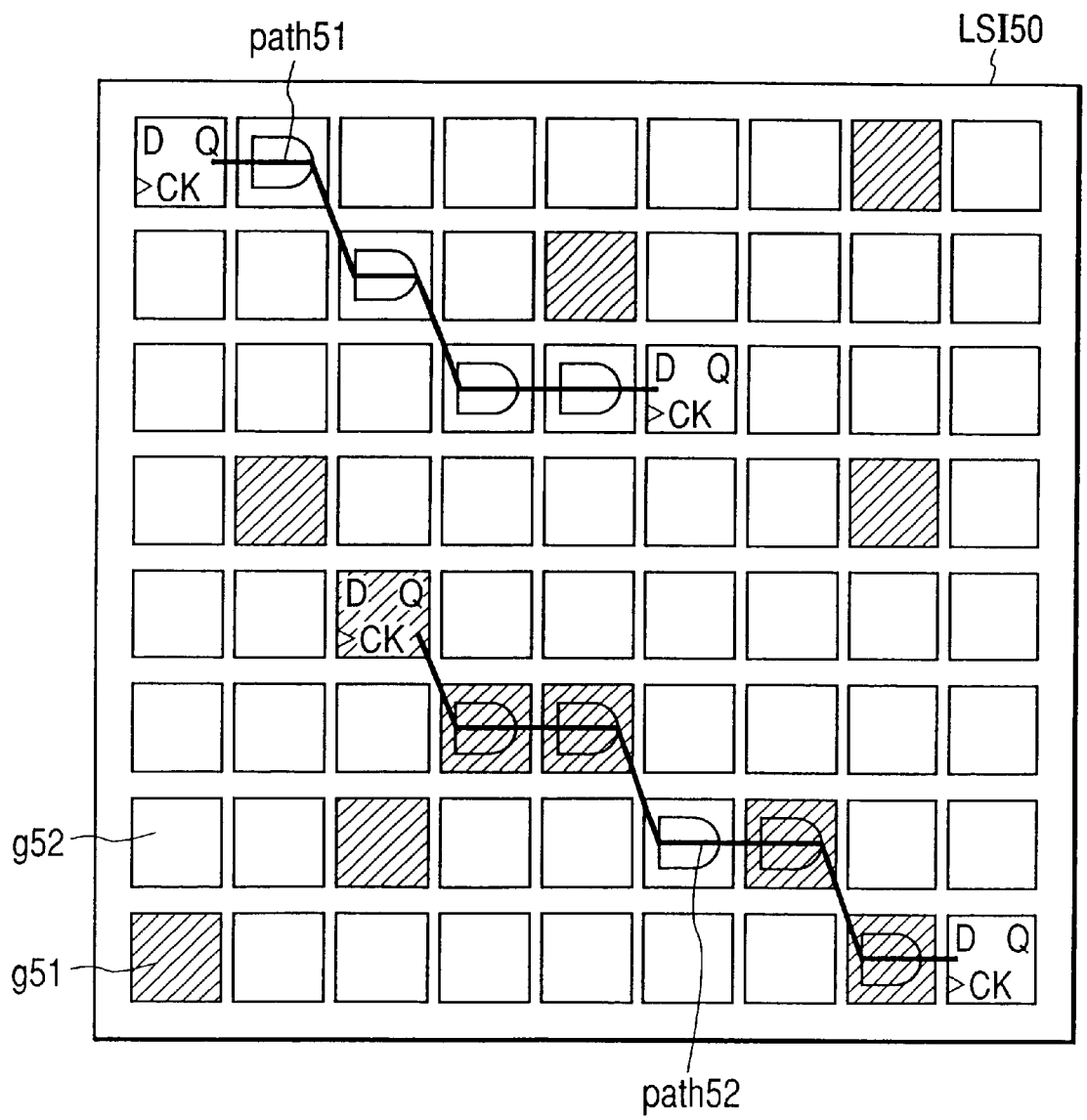
FIG. 5 is a diagram showing a configuration of logic gates in an embodiment of a semiconductor integrated circuit of the present invention.

As shown in FIG. 5, according to this method, a threshold voltage of a MOSFET constituting a logic gate located in any place in a semiconductor integrated circuit can be freely changed. In FIG. 5, a logic gate is indicated by a square in a symbolic manner. A square which is shown in half-tone, for example g51 is a logic gate constituted of MOSFETs each with a low threshold voltage and a square which is shown in white, for example g52 is a logic gate constituted of MOSFETs each with a high threshold voltage. In the figure, a path from the f11 to the f12 of FIG. 2 is shown as path51 and a path form f13 to the f14 of FIG. 2 is shown as path 52.

However, in this method, the number of steps in each of which an impurity is distributed in a substrate, for example the number of steps of ion implantation, is necessary to be equal to the number of kinds of MOSFETs which are used.

Figure 25:
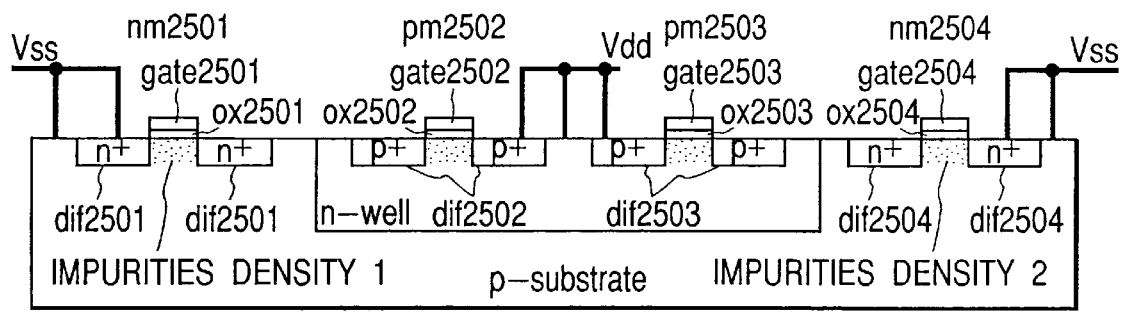
FIG. 25 is a sectional view of a device structure in a second embodiment of a semiconductor integrated circuit device of the present invention.

FIG. 25 shows a view in depthwise section of a device structure in a second embodiment of two inverters constructed of MOSFETs with respective two kinds of threshold voltages, higher or lower, of FIG. 12 when this method is adopted. Since the embodiment of FIG. 12 employs a complementary MOSFET, there is adopted a double well structure that n well is formed in part of a p type substrate surface. $N^+$ source/drain regions diff2501, a diff2504, gate oxide films ox2501, ox2504, a gate electrode gate2501 and a gate 2504 are formed in the surface layer of p substrate and thus n channel MOSFETs nm2501, nm2504 are constructed. P channel MOSFETs pm2502, pm2503 respectively constructed of $p^+$ type source/drain regions diff2502, diff2503, gate oxide films ox2502, ox2503, gate electrodes gate2502 and gate2503 are formed on n well region surface layer. The Vdd is connected to a source and an n well of the p channel MOSFET, and the Vss is connected to a source of the n channel MOSFET and the p substrate.

Here, it is assumed that the inverter inv1 of FIG. 12 is formed with the nm2501 and nm2502 and the inverter inv2 of FIG. 12 is formed with the nm2504 and ni2503. Since the inv1 is constructed of MOSFETs each with a high threshold voltage, impurity densities (impurity density 1 of the figure) of the semiconductor substrate under the gate oxide films of the nm2501 and pm2502 are set high, while impurity densities (impurity density 2 of the figure) under gate oxide films of the nm2504 and pm2503 are set low.

A third means for fabricating a semiconductor integrated circuit with MOSFETs with respective different threshold voltages is to change a thickness of a gate oxide film of a MOSFET. With the means in use, too, there can be freely changed a threshold voltage of a MOSFET constituting a logic gate in any place of a semiconductor integrated circuit as shown in FIG. 5. However, with this method, too, in a fabrication process of a semiconductor integrated circuit, the number of steps, for example steps of thermal oxidation is necessary to be equal to the number of kinds of MOSFETs in use.

Figure 26:
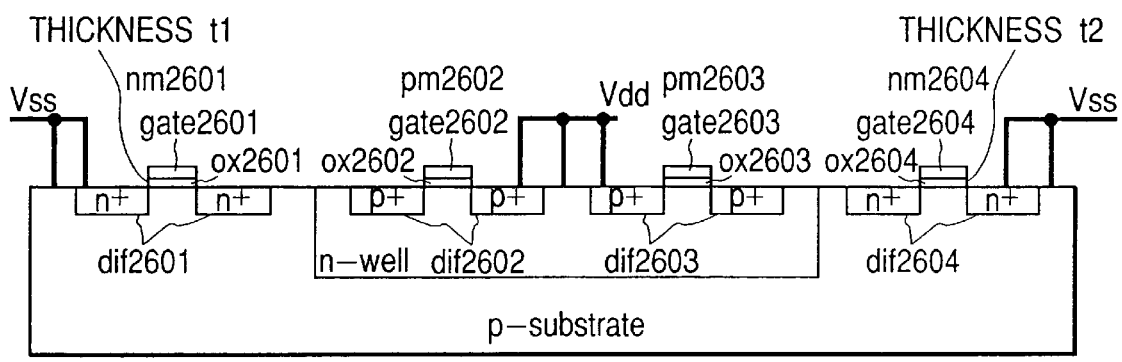
FIG. 26 is a sectional view of a device structure in a third embodiment of a semiconductor integrated circuit device of the present invention.

FIG. 26 shows a view in depthwise section of a device structure in a third embodiment of two inverters constructed of MOSFETs with respective two kinds of threshold voltages, higher or lower, of FIG. 12 when this method is adopted.

As in FIG. 25, the device structure assumes a double well structure that a n well is formed in part of a p type substrate surface layer. N+ type source/drain regions diff2601, diff2604, gate oxide films ox2601, ox2604 and gate electrodes gate2601, gate2604 are formed in part of the surface region of a p type substrate and thus n channel MOSFETs nm2601, nm2604 are fabricated. P channel MOSFETs pm2602, pm2603 constructed of p+ type source/drain regions diff2602, diff2603, gate oxide films ox2602, ox2603 formed on n well region surface layer.

In addition, Vdd is connected to a source and an n well of the p channel MOFET, and Vss is connected to a source of the n channel MOSFET and the p substrate. Here, it is assumed that the inverter inv1 of FIG. 12 is constructed of the nm2601 and pm2602 and the inverter inv2 of FIG. 12 is constructed of the nm2604 and pm2603. Thicknesses (thickness t1 in the figure) of gate oxide films of the nm2601, pm2602 are set large in order to construct the inv1 with MOSFETs each with a high threshold voltage for the inv1 and thicknesses (thickness t2 in the figure) of gate oxide films of the nm2604 and pm2603 are set small in order to construct the inv2 with MOSFETs each with a low threshold voltage.

A fourth means for fabricating a semiconductor integrated circuit with MOSFETs with respective different threshold voltages is to change a gate length. With the means in use, too, there can be freely changed a threshold voltage of a MOSFET constituting a logic gate in any place of a semiconductor integrated circuit as shown in FIG. 5.

Figure 6:
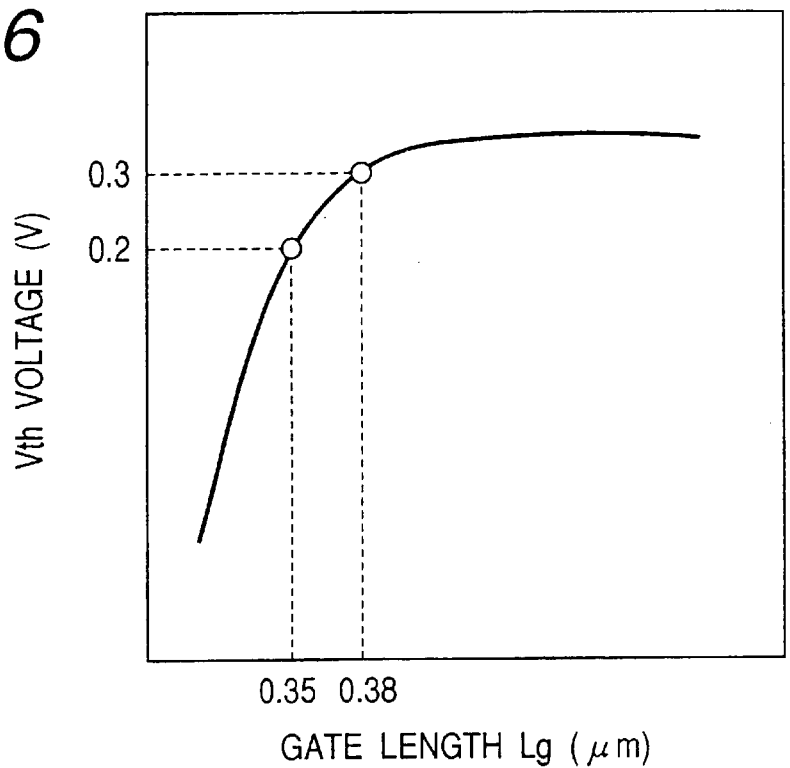
FIG. 6 is a graph showing a relation between a gate length and a threshold voltage.

FIG. 6 shows a relation between a gate length and a threshold voltage. For example, when two points shown on the graph of FIG. 6 are selected and a gate length is slightly changed, two kinds of MOSFETs with different threshold voltages, higher or lower, can be formed.

Figure 27:
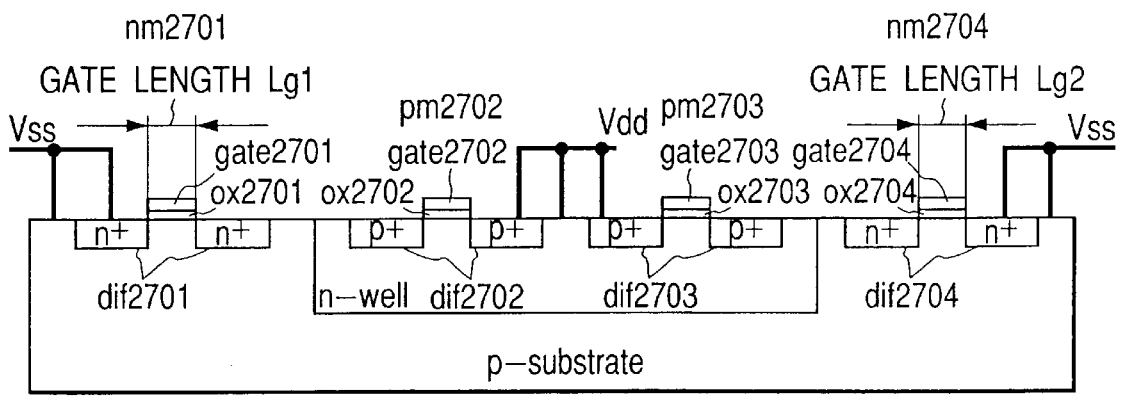
FIG. 27 is a sectional view of a device structure in a fourth embodiment of a semiconductor integrated circuit device of the present invention.

FIG. 27 shows a view in depthwise section of a device structure in a fourth embodiment of two inverters constructed of MOSFETs with respective two kinds of threshold voltages, higher or lower, of FIG. 12 when this method is adopted. As in FIG. 25, the device structure assumes a double well structure that a n well is formed in part of a p type substrate surface layer. $N^+$ type source/drain regions diff2701, diff2704, gate oxide films ox2701, ox2704 and gate electrodes gate2701, gate2704 are formed in the surface layer of the p type substrate and n channel MOSFETs nm2701, nm2704 are thus fabricated. P channel MOSFETs pm2702, pm2703 constructed of $p^+$ type source/drain regions diff2702, diff2703, gate oxide films ox2702, ox2703 are formed on n well region surface layer. Besides, Vdd is connected to a source and n well of the p channel MOSFET and Vss is connected to a source of the n channel MOSFET and the p substrate.

Here, it is assumed that the inverter inv1 of FIG. 12 is constructed of the nm2701 and pm2702 and the inverter inv2 of FIG. 12 is constructed of the nm2704, pm2703. Gate lengths (gate length Lg1 in the figure) of the nm2701, pm2702 are set large in order to construct the inv1 with MOSFETs each with a high threshold voltage and gate lengths (gate length Lg2 in the figure) of the nm2704 and pm2703 are set small in order to construct the inv2 with MOSFETs each with a low threshold voltage.

Figure 7:
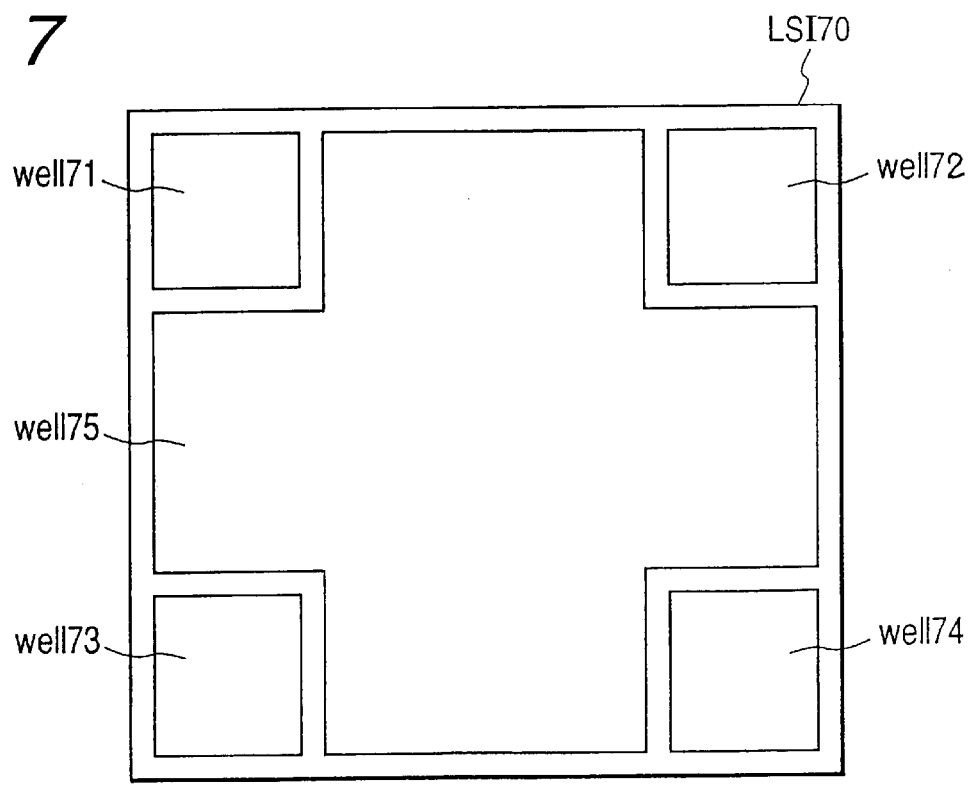
FIG. 7 is a representation of a structure of an embodiment of a well region in a semiconductor integrated circuit device of the present invention.

In FIG. 7, there will be described a second means for realizing MOSFETs each with different threshold voltages in an embodiment of the present invention. The second means for fabricating a semiconductor integrated circuit with MOSFETs with different threshold voltages is to change a bias voltage value supplied to a substrate of the MOSFET. In order to attain the change, well regions are required to be electrically separated in order to supply different substrate bias voltages to MOSFETs with respective different threshold voltages.

In addition, substrate bias operating potential supply lines are required for supply electricity to respective well regions. For that reason, it is not realistic that a threshold voltage of a MOSFET of a logic gate in an arbitrary place is freely changed as in FIG. 5, since increase in an area requirement is large.

Therefore, as shown in FIG. 7, a layout is performed fabricating MOSFETs with the same threshold voltage in group in the same well region. However, when this means is employed, there is an advantage that no additional fabrication steps are necessary for formation of MOSFETs with respective plural threshold voltages.

In FIG. 7, there is shown an embodiment in which well regions well71 to well75 are formed on a semiconductor integrated circuit LS170. Here, the well regions well71 to well74 are used for MOSFETs each with a low threshold voltage and the well region well 75 is used for MOSFETs each with a high threshold voltage. In this case, since there arises a restriction according to the value of a threshold voltage of a MOSFET on selection of a place where a logic gate including the MOSFET with the threshold voltage is constructed, there is needed to observe the restriction in layout of logic gates.

FIG. 7 is a structure of an embodiment in which logic gate constructed of MOSFETs each with a low threshold and logic gates constructed of MOSFETs each with a high threshold voltage are disposed on a chip in an areal ratio of 1 to 3. This ratio is determined according to a target operating frequency, a target leakage current value and characteristics of a logic circuit incorporated in the device. When the present invention is applied to a gate array, there is estimated in advance an approximate value of a ratio in use between logic gates constructed of MOSFETs each with a low threshold voltage and logic gates constructed of MOSFETs each with a high threshold voltage and a substrate with diffusion layers already fabricated therein is prepared under the estimation. When MOSFETs with two kinds of threshold voltages are used as shown in FIG. 7, there arises a necessity for provision of two kinds of operating potential supply lines for two kinds of substrate bias supply.

While in FIG. 7, there is shown an embodiment in which either n channel MOSFETs or p channel MOSFETs are used as a single kind, there will be described an embodiment in which a semiconductor integrated circuit is constructed of a complementary MOSFET comprising both of an n channel MOSFET and a p channel MOSFET. In the case of a complementary MOSFET, there is a need for a p well for fabricating an n channel MOSFET and an n well for fabricating a p channel MOSFET and a triple well structure is used for controlling respective bias voltages in a variable manner.

Figure 8:
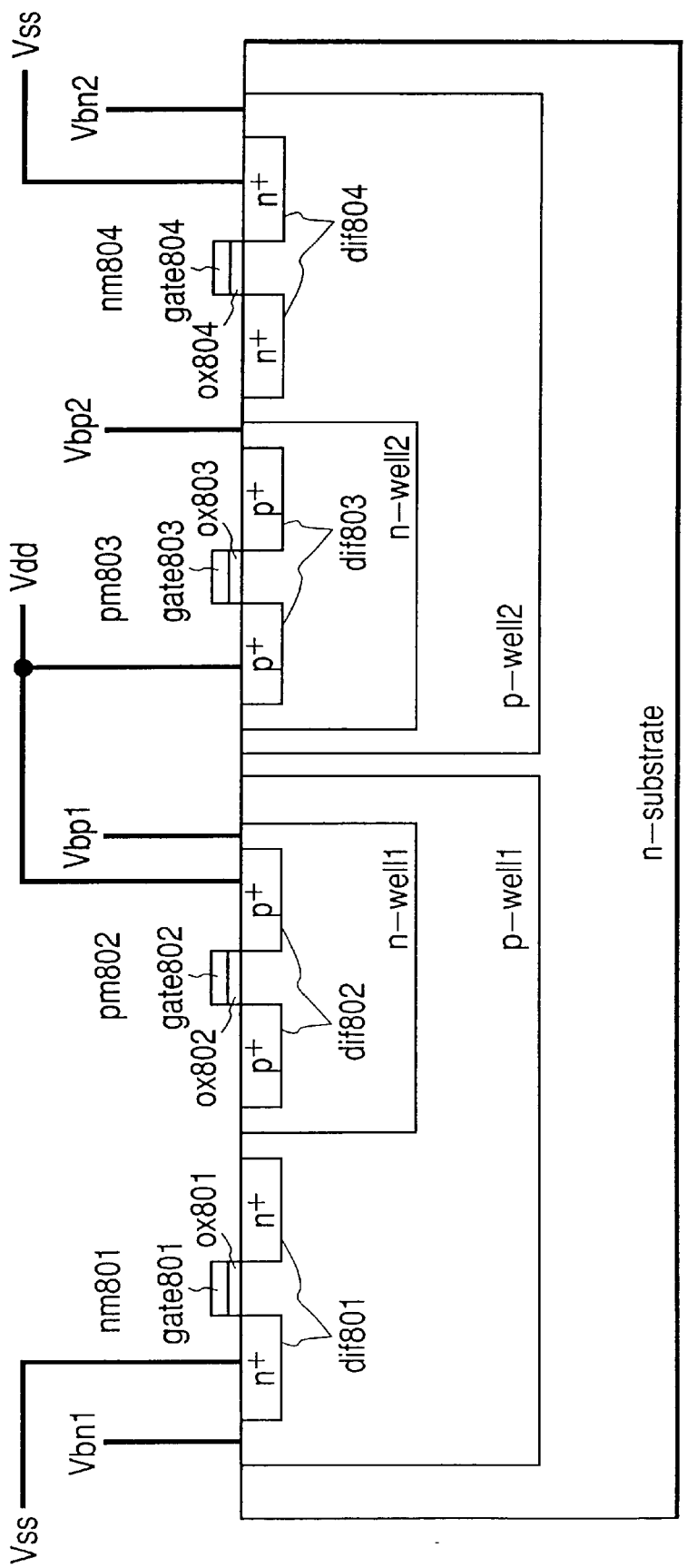
FIG. 8 is a sectional view of a device structure in an embodiment of a semiconductor integrated circuit device of the present invention.

FIG. 8 shows a depthwise structure of a device which adopts a triple well structure in the embodiment of two inverters constructed of MOSFETs with two kinds of threshold voltages, higher or lower of FIG. 12. The triple well structure is such that two well regions, that is a p well p-well1 and a p well p-well2 which are electrically insulated are formed in part of a n type substrate surface layer, an n well n-well1 is formed in part of a surface layer of the p-well1 and an n well n-well2 is formed in part of a surface layer of the p-well 2. N+ source/drain regions diff801, diff804, gate oxide films ox801, ox804 and gate electrodes gate801, gate804 are formed in the p well surface layer and n channel MOSFETs nm801, nm804 are thus fabricated. P channel MOSFETs pm802, pm803 are constructed with p+ type source/drain regions diff802, diff803, gate oxide films ox802, ox803 and gate electrodes gate802, gate803 which are fabricated in the n well region surface layer.

Vdd is connected to a source of the p channel MOSFET and Vss is connected to a source of the n channel MOSFET. Vbp1 is connected to an n well of the p channel MOSFET pm802 and Vbn1 is connected to a p well of the n channel MOSFET nm801. Besides, Vbp2 is connected to an n well of the p channel MOSFET pm803 and Vbn2 is connected to a p well of the n channel MOSFET nm 804. Here, it is assumed that the inverter inv1 of FIG. 12 is constructed of the nm801 and pm802 and the inverter inv2 of FIG. 12 is constructed of the nm804 and pm803.

In order to construct the inv1 with MOSFETs each with a high threshold voltage and the inv2 with MOSFETs each with a low threshold voltage, Vbp1 is set at a higher voltage than Vbp2 and Vbn1 is set at a lower voltage than Vbn2. The respective voltages are set, for example at Vdd=1.5 V, Vss=0V, Vbp1=2.0 V, Vbn1=−0.5 V, Vbp2=1.5 V, Vbn2=0V and the like.

Figure 16:
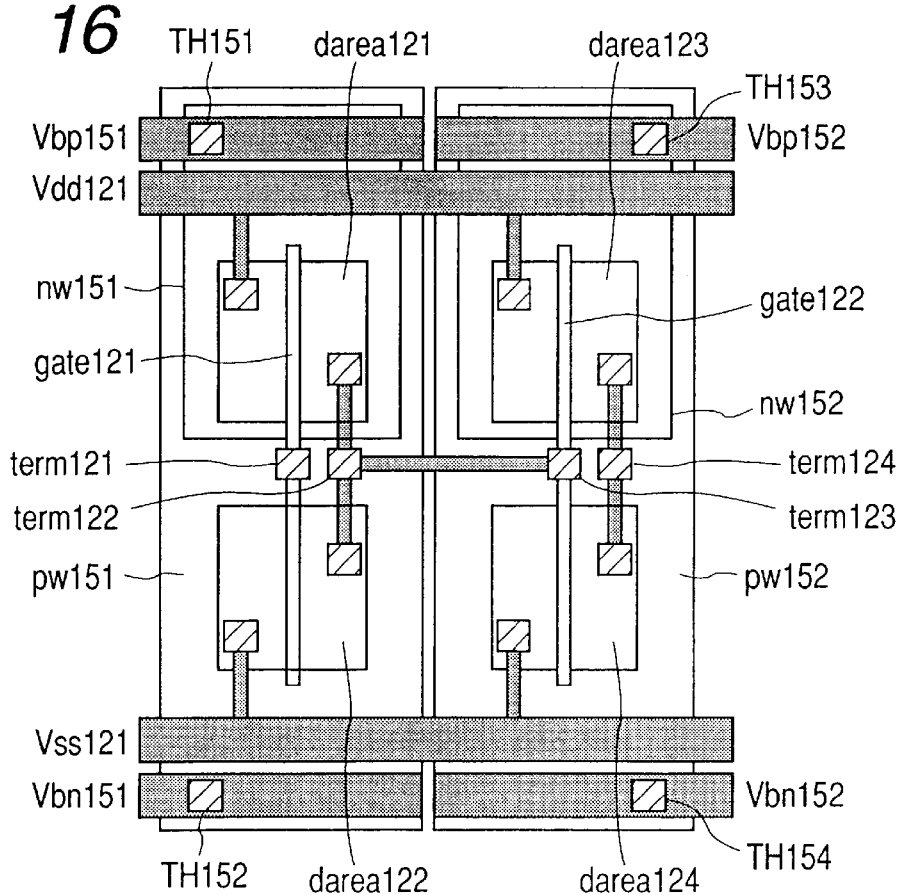
FIG. 16 is a diagram of a second embodiment of a layout of a semiconductor integrated circuit device of the present invention.

FIG. 16 shows a plan view of the layout of the circuit of FIG. 12 according a device having the structure of FIG. 8. What is different between FIGS. 16 and 15 is that a first p channel MOSFET pm1 constructed of a first gate electrode gate121 and a p+ source/drain region darea121 and a second p channel MOSFET pm2 constructed of a second gate electrode gate122 and a p+ source/drain region darea123 are respectively formed on different n well regions nw151, nw152. Likewise, a first n channel MOSFET m11 constructed of a first gate electrode gate121 and an n+ source/drain region darea122 and a second n channel MOSFET nm2 constructed of a second gate electrode gate122 and an n+ channel source/drain region darea124 are respectively formed on different p well regions pw151, pw152.

This is because there is a necessity for electrically separation between a MOSFET with a low threshold voltage and a MOSFET with a high threshold voltage in order to apply different potentials to respective well regions according to whether a potential is supplied to a MOSFET with a low threshold voltage or a MOSFET with a high threshold voltage. The nw151 is supplied with a bias voltage by a third operating potential supply line Vbp151 through a through hole TH151, the nw152 is supplied with a bias voltage by a fourth operating potential supply line Vbp152 through a through hole TH153, the pw151 is supplied with a bias voltage by a fifth operating potential supply line Vbn151 through a through hole TH152 and the nw152 is supplied with a bias voltage by a sixth operating potential supply line Vbn152 through a through hole TH154. According to a method in which a bias voltage supplied to a substrate of a MOSFET is changed, while a layout area is larger for the reason that there arise needs for a new operating potential supply line, separation between well regions as shown in FIG. 16 and the like, there is an advantage that a threshold voltage of a MOSFET can be changed without addition of a new step in a fabrication process of a semiconductor integrated circuit as in the case of FIG. 15.

Figure 9A:
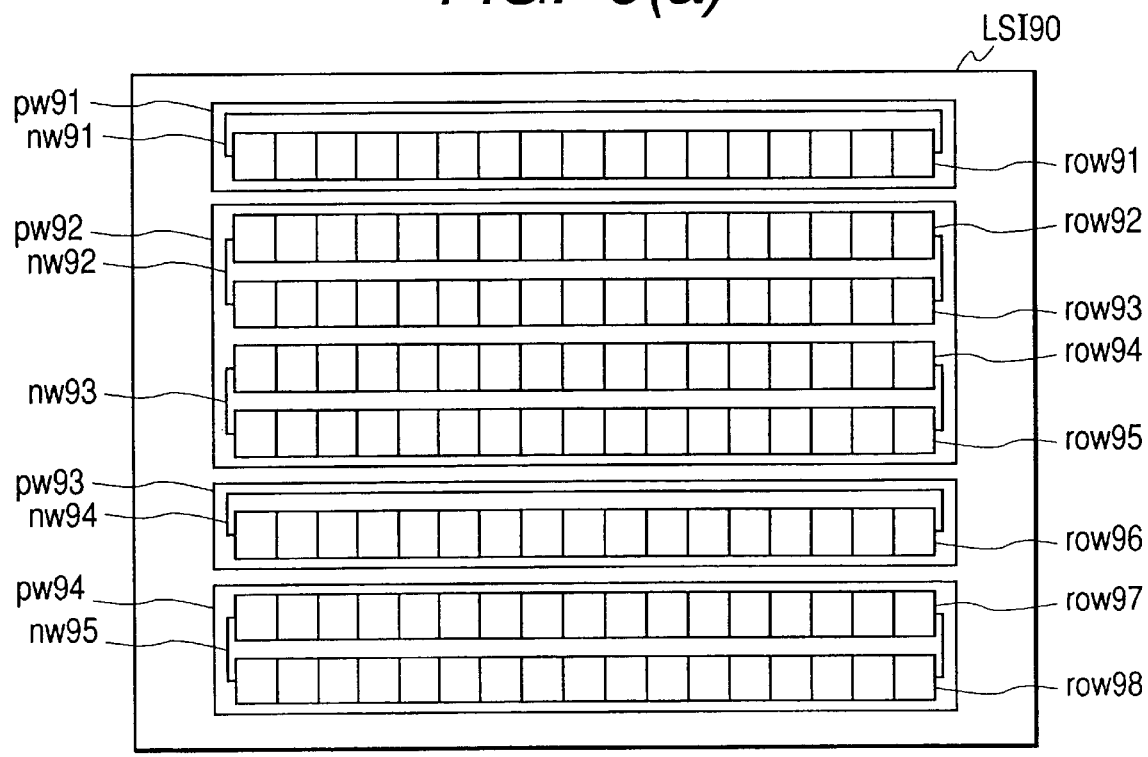
FIGS. 9A, 9B are representations of a structure of a second embodiment of a well region in a semiconductor integrated circuit device of the present invention.
Figure 9B:
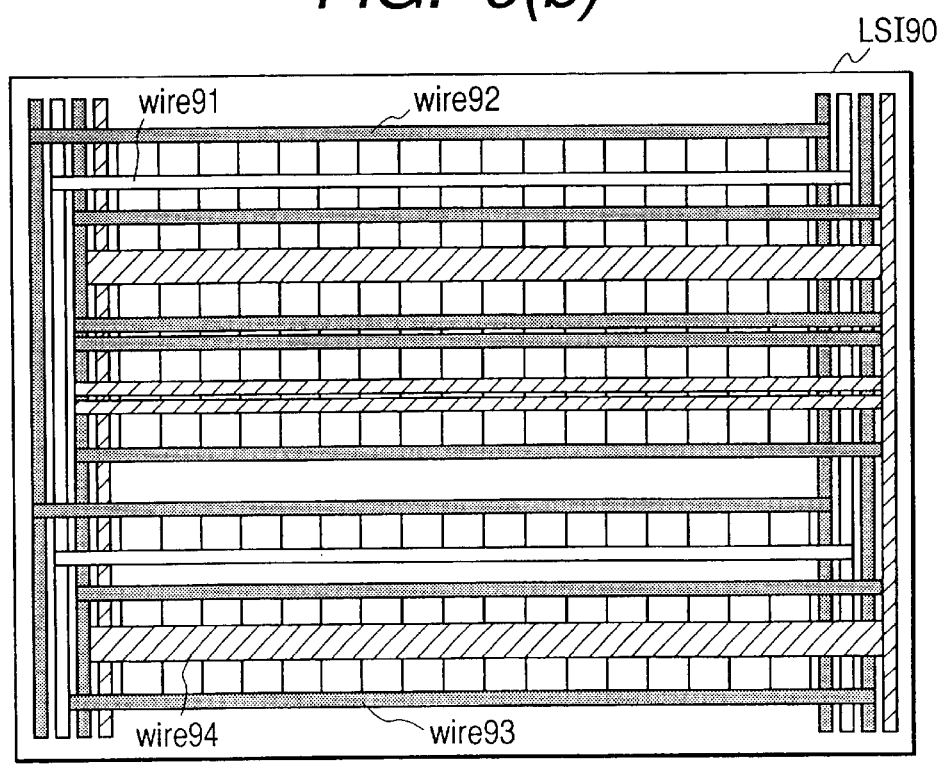

FIGS. 9A, 9B show an embodiment of a semiconductor integrated circuit device of the present invention constructed of a complementary MOSFET shown in FIG. 8. FIG. 9A is the embodiment in which logic gates are disposed in a line along a transverse direction and a plurality of rows row 91 to 97 are disposed along longitudinal directions and logic gates are thus disposed in a two dimensional configuration. In the embodiment, a logic gate is indicated by a rectangle and an internal pattern is not shown, but p channel MOSFETs and n channel MOSFETs are disposed upward and downward. Here, logic gates on the row 91 and row 96 are constructed of MOSFETs each with a low threshold voltage and logic gates on the other rows are all constructed of MOSFETs each with a high threshold voltage.

In this case, there is needed four p well regions pw91 to pw94 which are insulated from each other. Since the row92, row93, row94 and row95, which arranged in an adjacent manner, are constructed of MOSFETs each with the same threshold voltage, therefore a p well region pw 92 are allocated for them as a common region. Likewise, the row 97 and row98 own the p well region pw94 commonly with each other. In addition, five n well regions nw91 to nw95 are required. In the case of n well regions, the circumstances with the p well regions are held in the same way. The adjacent row92 and row93 commonly own one n well region nw92, the row 94 and row 95 again one n well region nw93, the row97 and row98 one n well region nw95.

FIG. 9B shows operating potential supply lines for supply substrate bias source in the configuration of FIG. 9A in FIG. 9B. In FIG. 9B, well regions are omitted for avoidance of complexity. Wire91 to wire94 are disposed in parallel to a row. In addition, there are shown an example in which interconnects are disposed along directions perpendicular to the rows for reinforcement. Bias sources are respectively supplied to well regions; in which wire91 supplies a source to a p well of MOSFETs each with a high threshold voltage, wire92 to an n well of MOSFETs each with a high threshold voltage, wire93 to a p well of MOSFETs each with a low threshold voltage and wire94 to an n well of MOSFETs each with a low threshold voltage. By such a layout, separation between wells is minimized and increase in an area requirement can be minimized in the case where a semiconductor integrated circuit is constructed of MOSFETs with respective different threshold voltages by use of means to change a bias voltage value supplied to a substrate.

Then, there is shown an embodiment in which a second means to realize MOSFETs each with different threshold voltages is attained by use of an SOI (Silicon On Insulator) device structure. When the SOI device structure is adopted, well regions are not necessary to be individually separated. Therefore, there is no need that MOSFETs each with the same threshold voltage are grouped in one well region. In this case, a MOSFET with an arbitrary threshold voltage can be disposed in an arbitrary place on a semiconductor integrated circuit as shown FIG. 5. However, the second means to realize MOSFETs with different threshold voltages requires operating potential supply lines for achievement the different threshold voltages.

Figure 22:
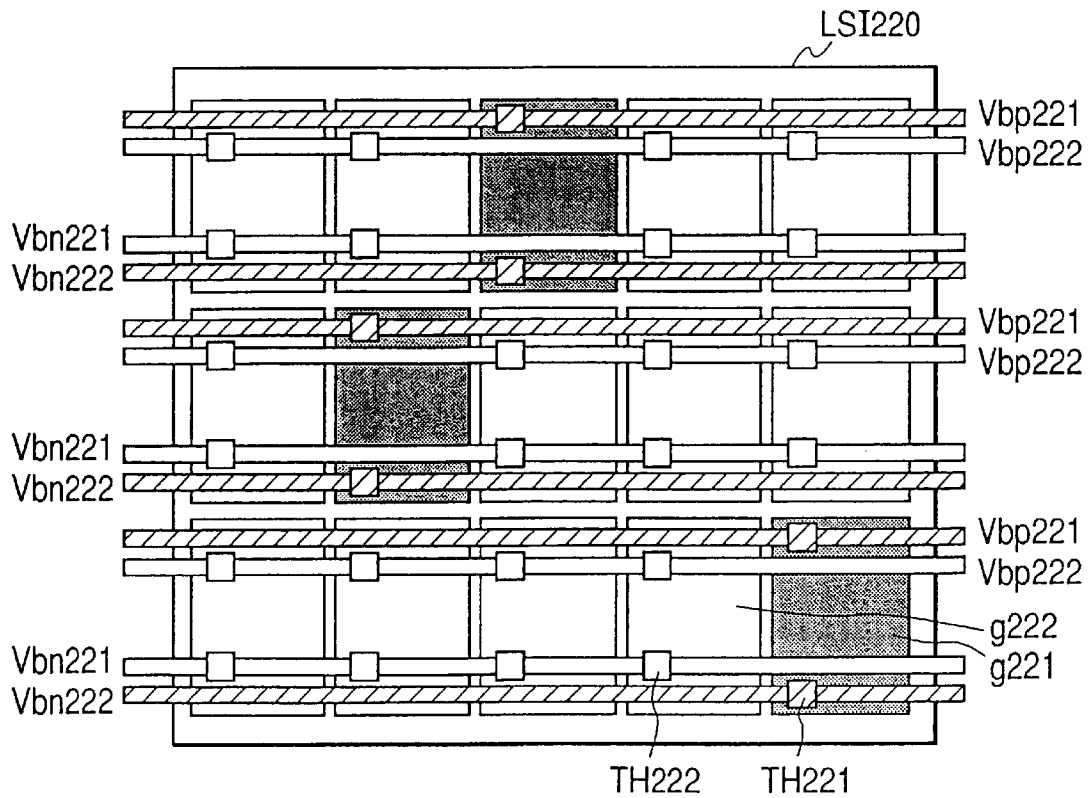
FIG. 22 is a layout diagram of a semiconductor integrated circuit device in the case where the present invention is executed using an SOI device structure.

FIG. 22 shows an embodiment therefor. A semiconductor integrated circuit LSI220 is the embodiment in which logic gates constructed of complementary MOSFETs each having an SOI structure are disposed in rows. In the figure, logic gates, for example g221 and g222 are indicated by rectangles. A rectangle which is darkened in half tone like g221 indicates a logic gate constructed of MOSFETs each with a low threshold and a white rectangle indicates a logic gate constructed of MOSFETs each with a high threshold voltage.

There are disposed, in parallel, a substrate bias potential supply line Vbp221 for p channel MOSFETs each with a low threshold voltage, a substrate bias potential supply line Vbp222 for p channel MOSFETs each with a high threshold voltage, a substrate bias potential supply line Vbn221 for n channel MOSFETs each with a low threshold voltage and a substrate bias potential supply line Vbn221 for n channel MOSFETs each with a low threshold voltage.

In the figure, a potential power supply line for a source electrode of each of MOSFETs is omitted. The potential supply lines are connected to substrates through through-holes TH221, TH222 and a bias source is supplied to a substrate of each of MOSFETs constituting a gate. As in the figure, there are laid, as interconnection, bias potential supply lines in parallel to the rows are provided in number which is equal to the number of kinds of threshold voltages (however, in the case of complementary MOSFETs, potential supply lines are required for a p channel MOSFET and an n channel MOSFET respectively) and through-holes are bored at necessary positions according to threshold voltages, higher or lower and thereby MOSFETs with different threshold voltages can be placed in any places in the device.

That is, in the present invention, since increase in area requirement is small in the case where there is used means in which a threshold voltage of a MOSFET is changed by changing a substrate bias source, it is more preferred that an SOI device structure is adopted.

Then, there will be described an embodiment of a storage medium on which there is stored a cell library necessary for designing a semiconductor integrated circuit of the present invention which has been described. Prior to entry to description of the embodiment, there will be given a brief description of a cell and a cell library, first of all. In general, there is used a component having a logic function on a small scale, which is called a cell, and which has been designed in advance in designing a semiconductor integrated circuit. A cell is registered in a cell library in the form of information comprising internal circuit elements and connection thereof; a layout pattern; and the like, which are already designed and in addition to them, a shape, terminal positions for external connection, a logic function, delay characteristics, consumption power performance and the like. When storage mediums on each of which a cell library is stored are distributed, it is possible to use components, which have been guaranteed with respect to a designed operation, in a great number of semiconductor integrated circuits.

Figure 10:
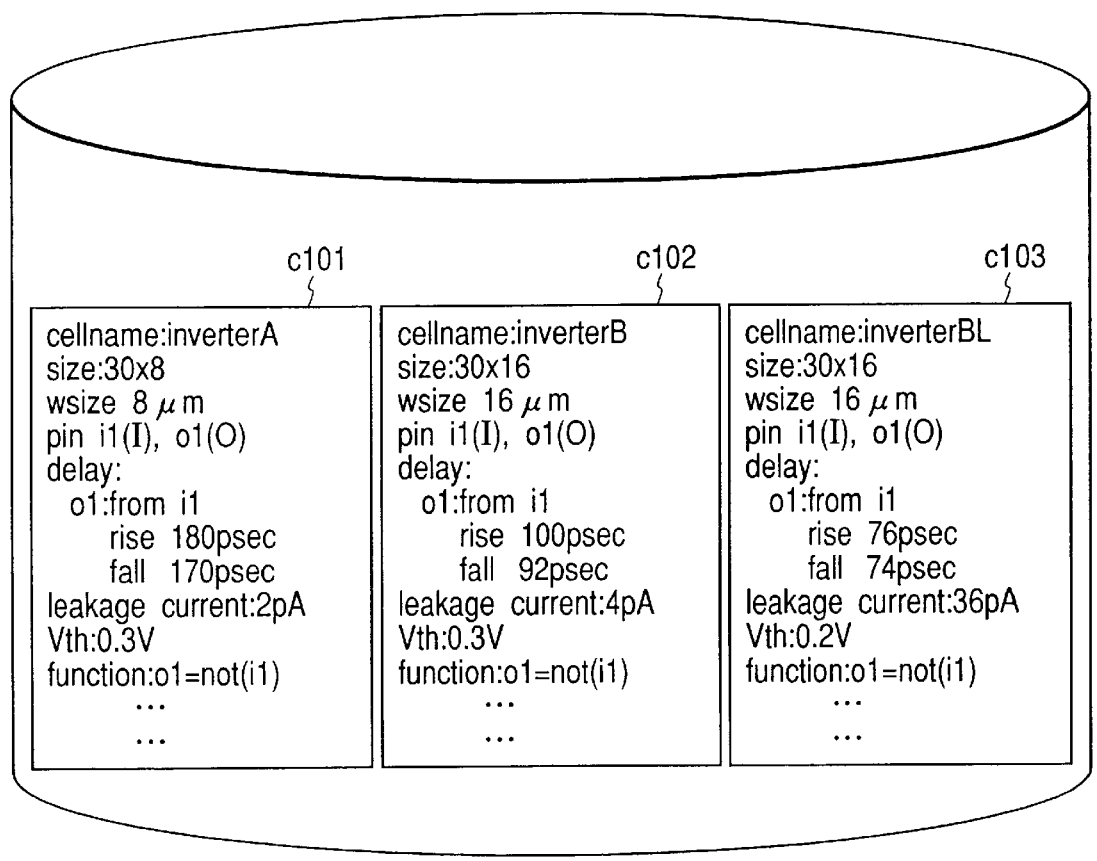
FIG. 10 is a representation of an embodiment of a storage medium on which there is stored a cell library of the present invention.
Figure 11:
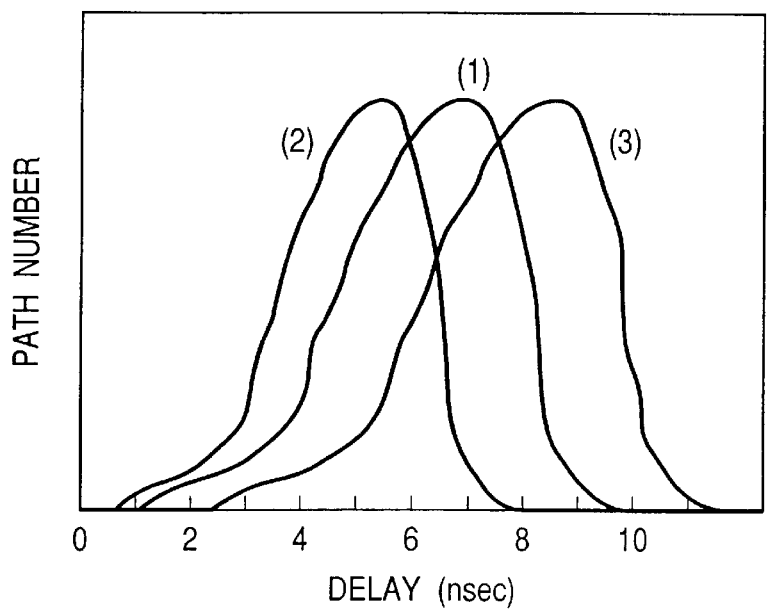
FIG. 11 is a graph showing an example of a distribution of delay values in general signal paths.

FIG. 10 shows an embodiment of a storage on which a cell library of the present invention is stored. In the embodiment of FIG. 10, three kinds of inverter cell are registered. As cell information on a cell, there are written on cells in the embodiment: a name, a size, a gate length, pin delay characteristics, a leakage current, a threshold voltage, a function and the like. A mark c101 indicates a standard inverter cell and a mark c102 indicates a cell in which a gate width W of a MOSFET is two times as large.

When a plurality of cells having the same function are prepared in the prior art like this, there are kept in stock cells which have different gate widths and different delay characteristics. The c103, which is same as the c102 in gate width and size, is different from the c102 in delay characteristics and consumption power characteristics only. That is, the c103 is a cell constructed of MOSFETs each with a low threshold voltage, again in other words a cell whose leakage current is large, but whose delay is small.

In order to design and fabricate a semiconductor integrated circuit device of the present invention as described above, a library shown in FIG. 10 is a necessity. For example, in a fabrication process of a semiconductor integrated circuit device of the present invention, when MOSFETs with different threshold voltages are employed, specific mask patterns are required in processes in which an impurity is selectively added and thicknesses of gate oxide films are chosen according to places as has been described above.

In manufacturing such mask patters, there arises a necessity for information on a cell and layout of interconnects of an integrated circuit which has been designed, on cell connection and for recognition of which cell is constructed of MOSFETs each with what threshold voltage value. The information on a threshold voltage of a MOSFET of each cell has been stored on a storage medium on which a cell library of the present invention and therefore, when the information is applied, the above described mask patter can be manufactured. In this sense, in addition to a storage medium on which a cell library is stored, the present invention includes, in its scope, a storage medium, on which there is stored connecting relations of cells and interconnects, that is a net list, on which there is further stored information whereby a MOSFET with a different threshold voltage is identified, since such a concept can be attained with ease from the present invention.

In the embodiment, while an inverter is shown, the present invention can be applied in the same way on: cells of AND, OR, NAND, a selector, a flip-flop and the like. It should be noted that application of the present invention has no specific limitation, in application, with respect to a kind of a cell.

Then, there will be described an embodiment of a designing method using a storage medium on which the library is stored.

Figure 23:
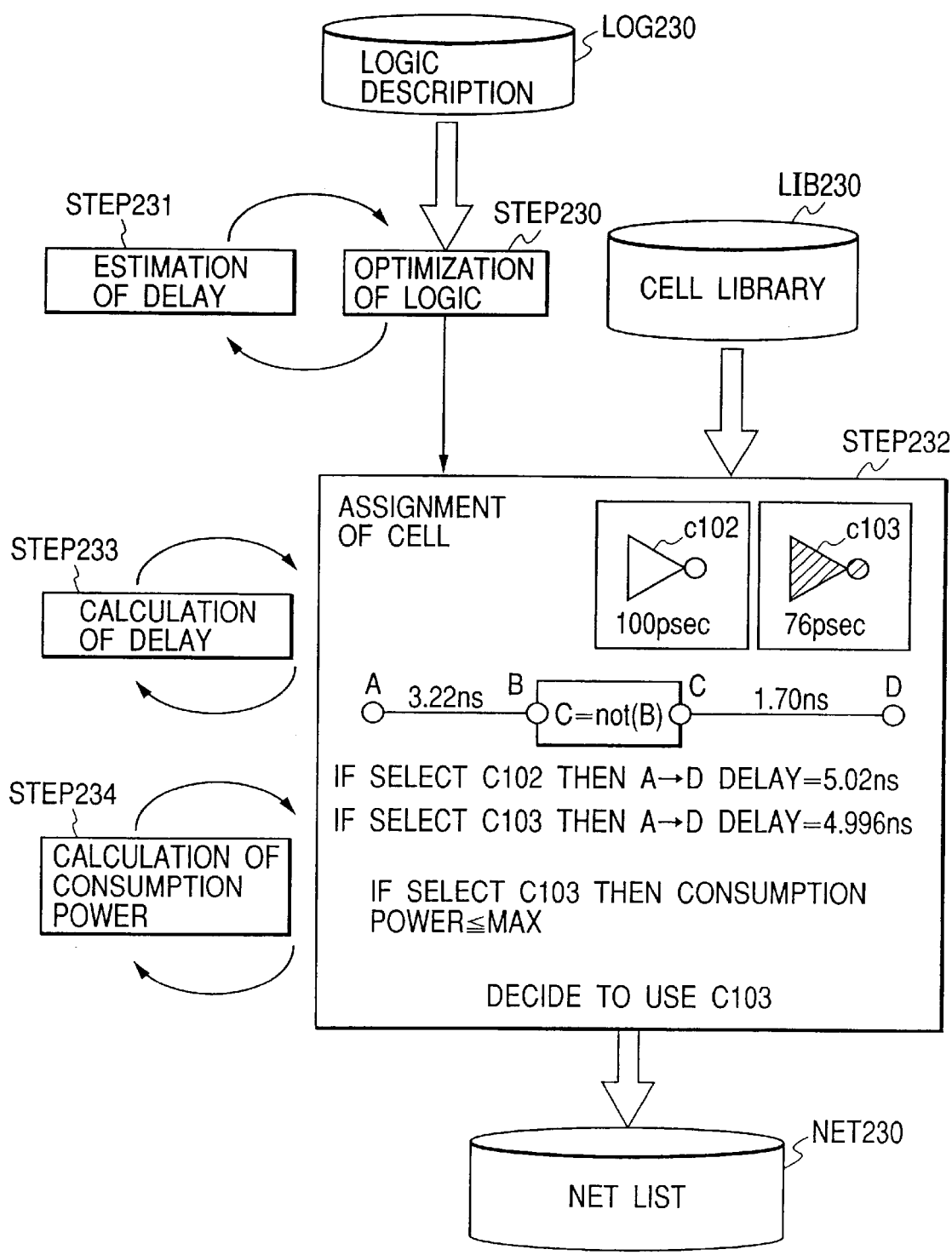
FIG. 23 is a representation showing an embodiment of a designing method for a semiconductor integrated circuit of the present invention.

FIG. 23 shows steps in the course in which a logic design is performed using a storage medium on which the cell library of FIG. 10. In the figure, a rectangular boxes step 230 to step 232 indicate processing, black arrows show processing flows and white arrows shows data flows. Logic description LOG230 is written by a high level logic description language, for example VHDL or the like. In the course of logic designing, the logic description LOG230 is read and logic optimization processing step230 is performed.

The logic optimization processing step230 is optimization processing which is not dependent on a technology and for example, processing in which the number of terms in a Boolean expression which expresses a logic is minimized. At this time, the optimization is performed based on a delay estimated by a delay estimation processing step231. Thereafter, cell assignment processing step232 is performed. This is processing in which a cell library LIB230 is read and a logic which is not dependent on a technology is assigned on an actual cell.

Here, delay calculation processing step233 and consumption power calculation processing step234 are repeatedly performed in order to achieve an optimal assignment and a net list net230 is output. Since the cell assignment processing is characteristic processing in a designing method of the present invention, a detailed example is shown on the figure. In this example, cell assignment is now executed on part of a path A to D. It is assumed that cell assignment on paths from A to B, from C to D have been completed and delays are 3.22 nsec and 1.70 nsec respectively. If a logic in a path from B to C is expressed by C=not (B), it is understood that this Boolean expression should be assigned to the inverter. If a target delay in a path from A to D is 5 nsec, a delay in an inverter is necessary to be 0.08 or less.

At this time, it is already understood as a result of reading of the cell library LIB230 that there are present cells c102 and c103 which have different delay values since they are cells with the same function, that is inverters, but have different threshold voltages. Here, delays and consumption powers are calculated in the cases where the respective cells are in use and as a result, a cell c103 with a low threshold voltage is selected.

Figure 24:
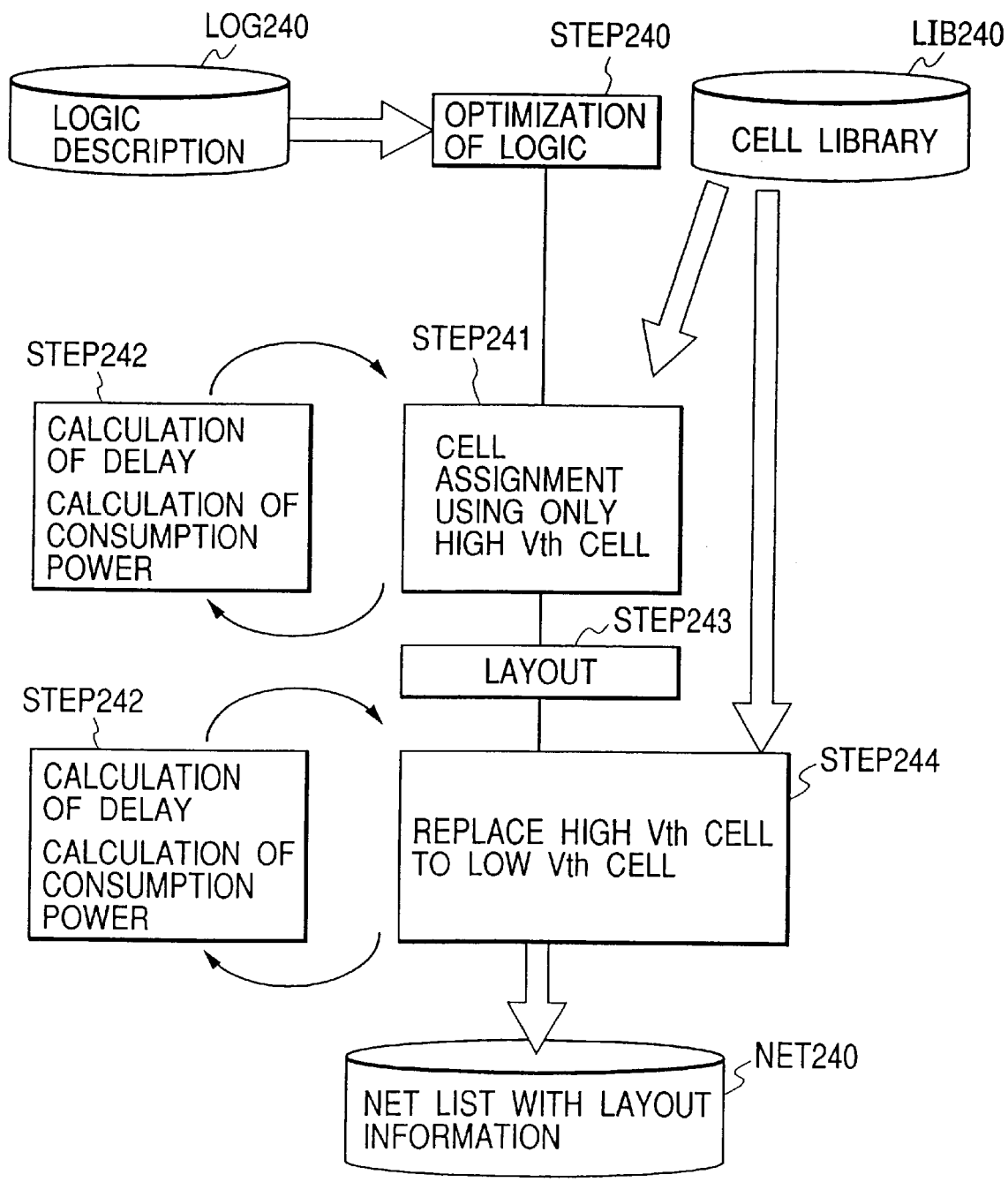
FIG. 24 is a representation showing a second embodiment of a designing method for a semiconductor integrated circuit of the present invention.

There will be described a second embodiment of a designing method using a storage medium on which the library is stored using FIG. 24. FIG. 24 shows steps in the course in which a logic design is performed using a storage medium on which the cell library of FIG. 10. A rectangular boxes step 240 to step 244 indicate processing, black arrows show processing flows and white arrows shows data flows as in FIG. 23. In the course of logic designing, the logic description LOG240 is read and logic optimization processing logic step240 is performed. This is same as step230 in FIG. 23. Thereafter, cell assignment processing step241, in which only cells with a high threshold voltage are used, is performed.

In a similar manner to the embodiment of FIG. 23, delay and consumption power calculation processing are repeatedly performed in order to achieve an optimal cell assignment under limitation that only cells with a high threshold voltage are used. Thereafter, layout processing step243 are performed. Then, delay and consumption calculation step242 is further performed in light of an actual wire length after layout and as a result of the calculations, calculation results with higher precision can be attained. After achievement of the calculation results with higher precision, if a delay violation path is present, there is performed processing step244 in which a cell on the delay violation path is replaced with a cell constructed of MOSFETs each with a low threshold voltage with the same function and there is output a net list net240 attached with layout information. Thereby, there can enjoyed an advantage that a delay violation can be eliminated without any change in its peripheral layout.

On the other hand, when a delay margin is left as a result delay calculation after cell assignment and layout are performed using only cells constructed of only MOSFETs each with a low threshold voltage on the contrary to the embodiment of FIG. 24, it is conceivable a method in which a cell on a path which has a delay margin is replaced with a cell constructed of MOSFETs each with a high threshold voltage.

Then, there will be described an embodiment in which the present invention is performed on a semiconductor integrated circuit comprising about 8000 cells. In the embodiment, a complementary MOSFET which has a gate length 0.25 μm is operated at Vdd=1.6 V, Vss=0 V.

Figure 18:
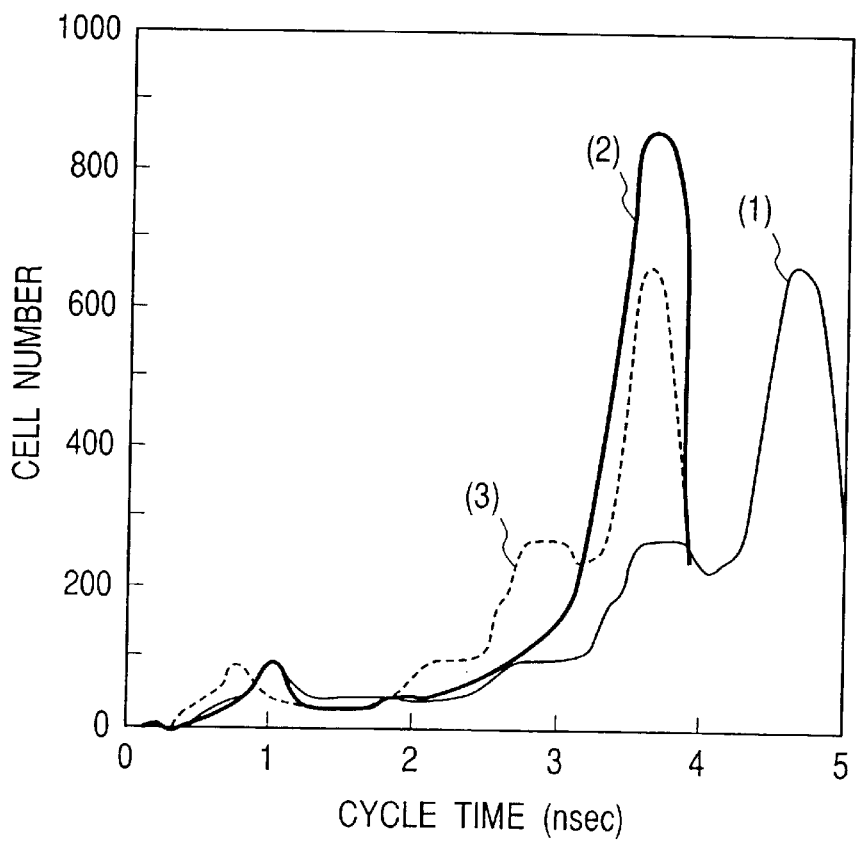
FIG. 18 is a graph showing a distribution of delay values in an embodiment of the present invention.

FIG. 18 is a graph in which a cycle time (the maximum path delay) is plotted using an abscissa and the number of cells included in a path corresponding to the delay value is potted using an ordinate. It is assumed that when cells are included in a plurality of paths, the cells are included in a path which shows the largest delay. A thin solid black line (1) indicates the case where MOSFETs each with a high threshold voltage (0.15 V) are uniformly used, a thick solid black line (2) indicates a result of the case where the present invention has been performed, wherein it is set that a high threshold voltage is 0.15 V and a low threshold voltage is −0.05 V, and the solid light black line (3) indicates the case where MOSFETs each with a low threshold voltage are uniformly used. The thin solid black line (1) has a path with the maximum of 5 nsec, while the thick solid black line (2) and the solid light black line (3) has the maximum delay of 3.95 nsec, both of which are understood to be adapted for a high speed operation.

However, in the case where a threshold voltage is uniformly lowered as in the case of (3), a region which originally has a small delay is also affected to assume a higher speed, wherein in terms of a shape of graph, a graph in the case (3) assume a shape which is the same as that of the case of (1) with a parallel displacement to the left. This shows that a path, whose delay value is equal to or less than a target value even when the path use MOSFETs each with a high threshold voltage, is also affected to assume a higher speed.

On the other hand, in (2) which is the result of the present invention, a distribution is not changed from that of the corresponding region of (1) and only part of the distribution in a range of 3.95 nsec to 5 nsec is compressed to the left. That is, (2) shows that a high speed operation is realized with no useless consumption of power.

Figure 17:
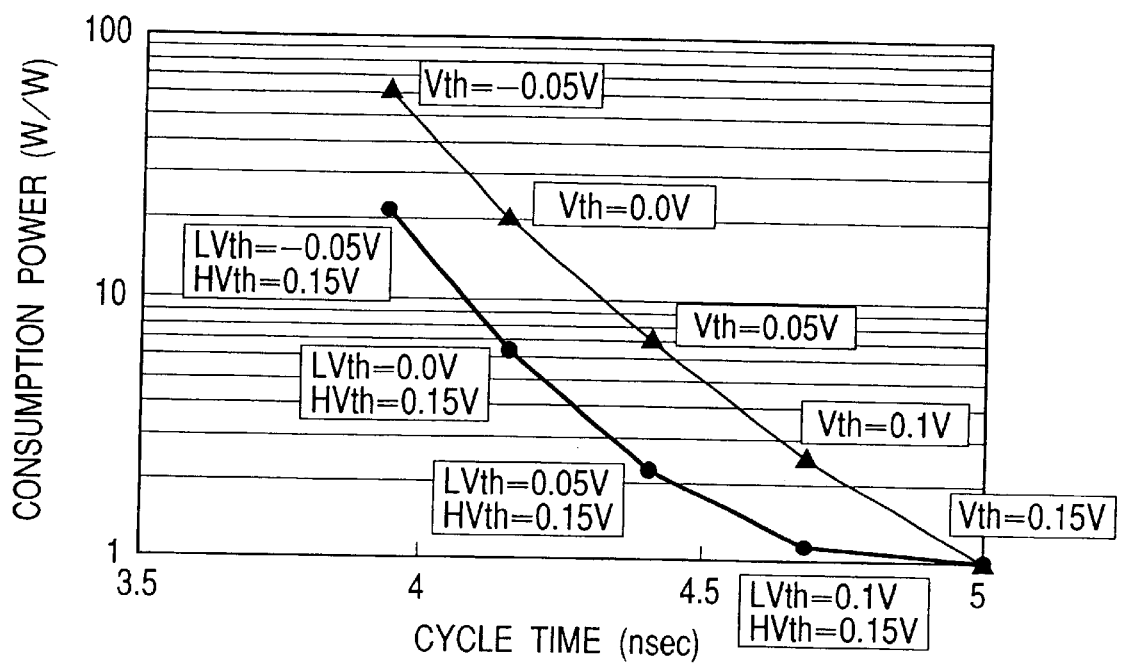
FIG. 17 is a graph showing a relation between a delay and consumption power in an embodiment of the present invention.

FIG. 17 is a graph in which a cycle time (the maximum path delay) is plotted using an abscissa and a consumption power due to a leakage current is plotted using an ordinate. The circuit is a circuit which operates at a cycle time 5 nsec (200 MHz) when MOSFETs each with a high threshold voltage (0.15 V) are uniformly used. A value of consumption power is normalized with consumption power when MOSFETs each with a high threshold voltage are uniformly used as 1.

In the figure, data marked by a triangle are a result of the case where threshold voltages are uniformly lowered and data marked by a circle are a result of the case where MOSFETs with two kinds of threshold voltages are used according to the present invention. A threshold voltage corresponding to a plotted data is attached on the side of the marked data. For example, in the present invention, when it is set that a low threshold voltage is −0.05 V and a high threshold voltage is 0.15 V and MOSFETs with two kinds of threshold voltages are used, a cycle time can be sped up to 3.95 nsec (253 MHz) and consumption power is about 20.

On the other hand, when threshold voltages are uniformly set at −0.05 V, a cycle time assumes 3.95 nsec in a similar manner, but consumption power is equal to or more than 60. It is understood that while, when threshold voltages are uniformly changed in a condition that consumption power due to a leakage current is suppressed to a level equal to or less than 10, a cycle time is 4.33 nsec (231 MHz), but according to the present invention, an operating speed can be increased up to a cycle time 4.07 nsec (246 MHz).

In FIG. 17, when the present invention is performed, a ratio of MOSFETs each with a low threshold voltage is 6% for operation at a low threshold voltage of 0.1 V, 15% for operation at a low threshold voltage of 0.05 V, 23% for operation at a low threshold voltage of 0.0 V and 30% for operation at a low threshold voltage of −0.05 V. It is desirable to restrain a ratio of MOSFETs each with a low threshold voltage to a value equal to or less than about 30% because a leakage current is increased as an exponential function is when a threshold voltage is decreased. Besides, it is desirable to restrain the ratio to a value equal to or less than 10% in order to suppress consumption power down to a proper value. According to the present invention, those are features of the invention that the number of MOSFETs each with a low threshold voltage can be minimized, and besides a ratio of MOSFETs each with a low threshold voltage to the total the number of MOSFETs is a value equal to or less than 30%.

From the above described embodiments, it is apparent that, with the present invention in execution, not only can increase in consumption power of MOSFETs due to a leakage current is suppressed to the minimum even at a high speed in an active operation, and thereby, a semiconductor integrated circuit device which can operate at a high operating speed can be realized.

Figure 28:
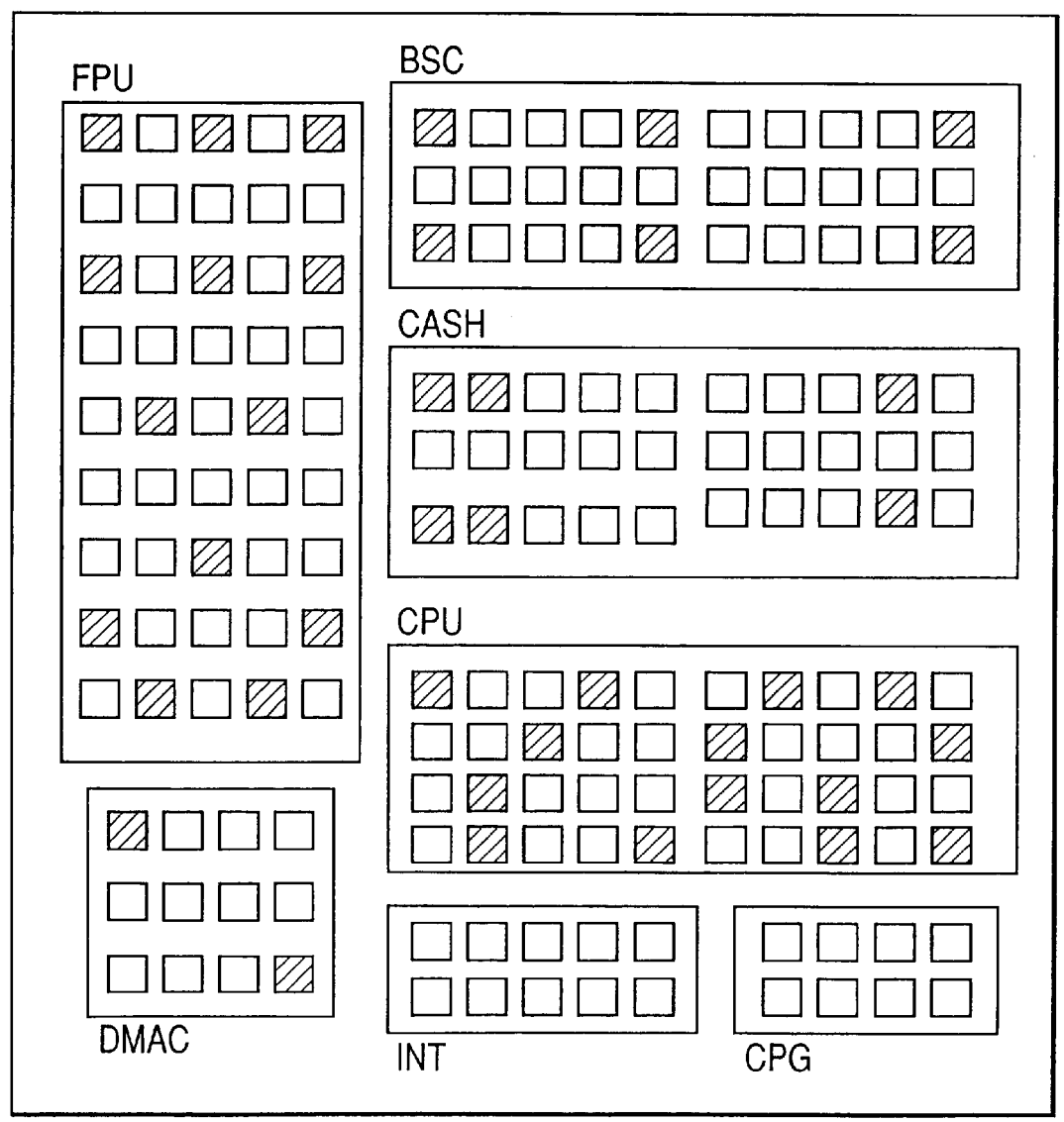
FIG. 28 is a representation of an embodiment in which a semiconductor integrated circuit device of the present invention is applied to a microprocessor.

FIG. 28 shows an embodiment in which a semiconductor integrated circuit device of the present invention is applied to a microprocessor. FIG. 28 shows main blocks of a micro processor and internal cell configuration is shown symbolically by rectangles.

In the embodiment of FIG. 28, the constituting blocks are: CPU (central processing unit), FPU (floating unit processing unit), cache (internal memory), BSC (bus control), DMA (direct memory access), CPG (clock pulse control) and INT (interrupt control). Each of cells in half tone among cells in each block has a low threshold voltage and each of cells in white has a high threshold voltage. For example, it is understood that CPU, FPU, cache and the like, which is critical in timing, have many cells with a low threshold voltage. A block INT and the like each of which has a margin in timing is less in ratio of cells with a low threshold voltage. In such a manner, according to the present invention, not only is a threshold voltage of each block simply changed, but even within the same block, MOSFETs each with a low threshold voltage and MOSFETs each with a high threshold voltage are selectively used in a proper manner and usage of MOSFETs each with a low threshold voltage can be minimized. Hence, a high speed operation and low consumption power can simultaneously be realized.

While the present invention is to realize a high speed operation at an active operation and a low consumption power, the present invention can be performed in combination with a publicly known technique of setting a threshold voltage to a high value, by controlling a substrate bias source in a standby state.

In the above described embodiments, while there has been described the case where two kinds of MOSFETs with different threshold voltages are used, there can be practiced with ease the case where MOSFETs with three or more kinds of threshold voltages are mixed, which is included in the scope of the present invention.

According to the present invention, as described above, there can be attained a semiconductor integrated circuit device which can operate at a high speed while suppressing increase in consumption power due to a leakage current at an active operation by constructing the semiconductor integrated circuit device through proper selection of MOSFETs with different threshold voltages even in the same functional block in a given operating condition.

While we have shown and described several embodiments in accordance with our invention, it should be understood that disclosed embodiments are susceptible of changes and modifications without departing from the scope of the inven-

What is claimed is:

1. A semiconductor integrated circuit device having logic gates constructed of switching elements formed on a semiconductor substrate, which performs given processing by the logic gates on at least one input signal and outputs at least one signal, the switching elements being composed of at least one signal, the switching elements being composed of at least two kinds of switching elements, wherein at least one of a process condition and a bias voltage applied to the substrate or a well of the switching elements is different between a first kind of the switching elements each with a first threshold voltage and a second kind of the switching elements each with a second threshold voltage, such that each of the first kind of the switching elements has lower threshold voltage than each of the second kind of the switching elements, wherein there are provided signal paths composed of a signal path from a first node to a second node, a signal path from the second node to a third node and a signal path from the second node to a fourth node, wherein a ratio of the number of logic gates constructed of switching elements each with the first threshold value to the total number of logic gates on the path from the first node to the second node, is larger than a ratio of the number of logic gates constructed of switching elements each with the first threshold value to the total number of logic gates on the path from the second node to the third node, or the path from the second to the fourth node.

2. A semiconductor integrated circuit device having logic gates constructed of switching elements formed on a semiconductor substrate, which performs given processing by the logic gates on at lest one input signal and outputs at least one signal, the switching elements being composed of at lest two kinds of switching elements, wherein at least one of a process condition and a bias voltage applied to a substrate or a well of the switching elements is different between a first kind of the switching elements each with a first threshold voltage and a second kind of the switching elements each with a second threshold voltage, such that each of the first kind of the switching elements has lower threshold voltage than each of the second kind of the switching elements, wherein there are provided signal paths composed of a signal path from a first node to a second node, a signal path from the third node to a second node and a signal path from the second node to a fourth node, wherein a ratio of the number of logic gates constructed of switching elements each with the first threshold value to the total number of logic gates on the path from the second node to the fourth node, is larger than a ratio of the number of logic gates constructed of switching elements each with the first threshold value to the total number of logic gates on each of the paths from the first node to the second node and from the third node to the second node.

3. A semiconductor integrated circuit device according to claim 1, wherein the paths from which the signals are transmitted are three kinds of paths: a first path is a path from an input pin of the semiconductor integrated circuit to an input pin of a state holding circuit which the signal reaches for the first time; a second path is a path from an output pin of the state holding circuit to an input pin of a second state holding circuit to an input pin of a second state holding circuit which the signal reaches for the second time; and a third path is a path from the second state holding circuit to an output pin of the semiconductor integrated circuit without transmitting a third state holding circuit, or part of each of the three kinds of paths.

4. A semiconductor integrated circuit device having logic gates constructed of switching elements formed on a semiconductor substrate, which performs given processing by the logic gates on at least one input signal and outputs at least one signal, comprising:

at least first, second and third state holding circuits;
at least first, second, third, fourth, fifth and sixth switching elements;
a first operating potential point which a first operating potential is supplied and a second operating potential point which a second operating potential is supplied; and
first, second and third nodes,
wherein an output pin of the first state holding circuit or an input pin of the semiconductor integrated circuit is connected to gates electrodes of the first and second switching elements directly or through at least one logic gate;
the first switching element is connected to the first operating potential point and the first node so that a source/drain path lies therebetween;
the second switching element is connected to the second operating potential point and the first node so that a source/drain path lies therebetween;
the first node is connected to gate electrodes of the third, fourth, fifth and sixth switching elements;
the third switching element is connected to the first operating potential point and the second node so that a source/drain path lies therebetween;
the fourth switching element is connected to the second operating potential point and the second node so that a source/drain path lies therebetween;
the fifth switching element is connected to the first operating potential point and the third node so that a source/drain path lies therebetween;
the sixth switching element is connected to the second operating potential point and the third node so that the source/drain path lies therebetween;
the second node is connected to an input pin of the second state holding circuit or an output pin of the semiconductor integrated circuit directly or through at least one logic gate; and
the third node is connected to an input pin of the third state holding circuit or an output pin of the semiconductor integrated circuit directly or through at least one logic gate,
wherein at least one of a process condition and a bias voltage applied to a substrate or a well of the switching elements is a different, such that a threshold voltage of the third switching element is higher than a threshold voltage of the first switching element, or a threshold voltage of the fourth switching element is higher than a threshold voltage of the second switching element.

5. A semiconductor integrated circuit device having logic gates constructed of switching elements formed on a semiconductor substrate, which performs given processing by the logic gates on at lest one input signal and outputs at least one signal, comprising:

at least first, second and third state holding circuits;
at least first, second, third, fourth, fifth, sixth, seventh and eighth switching elements;
a first operating potential point which a first operating potential is supplied and a second operating potential point which a second operating potential is supplied; and first, second and third nodes,
wherein an output pin of the first state holding circuit or an input pin of the semiconductor integrated circuit is connected to gate electrodes of the first and second switching elements directly or through at least one logic gate;
the first switching element is connected to the first operating potential point and the first node so that a source/drain path lies therebetween;
the second switching element is connected to the second operating potential point and the first node so that a source/drain path lies therebetween;
an output pin of the second state holding circuit or an input pin of the semiconductor integrated circuit is connected to gate electrodes of the third and fourth switching elements directly or through at least one logic gate;
the third switching element is connected to the first operating potential point and the second node so that a source/drain path lies therebetween;
the fourth switching element is connected to the second operating potential point and the second node so that a source/drain path lies therebetween;
the first node is connected to gate electrodes of the seventh and eighth switching elements;
the second node is connected to gate electrodes of the seventh and eighth switching elements;
the fifth and seventh switching elements are connected to the first operating potential point and the third node so that source/drain paths lie therebetween;
the sixth and eighth switching elements are connected to the second operating potential point and the third node so that source/drain paths lie therebetween; and
the third node is connected to an input pin of the third state holding circuit or an output pin of the semiconductor integrated circuit directly or through at least one logic gate,
wherein at least one of a process condition and a bias voltage applied to a substrate or a well of the switching elements is different, such that a threshold voltage of the first switching element is higher than a threshold voltage of the fifth or seventh switching element, or a threshold voltage of the second switching element is higher than a threshold voltage of the sixth or eighth switching element.

6. A semiconductor integrated circuit device having logic gates constructed of switching elements formed on a semiconductor substrate, which performs given processing by the logic gates on at least one input signal and outputs at least one signal, comprising:
at least first, second and third state holding circuits;
at least first, second, third, fourth, fifth and sixth switching elements;
a first operating potential point which a first operating potential is supplied and a second operating potential point which a second operating potential point is supplied;
first, second and third nodes; and
first and second logic gate groups in each of which a plurality of logic gates are in series connected;
wherein an output pin of the first state holding circuit or an input pin of the semiconductor integrated circuit is connected to gate electrodes of the first and second switching elements directly or through at least one logic gate;
the first switching element is connected to the first operating potential point and the first node so that a source/drain path lies therebetween;
the second switching element is connected to the second operating potential point and the first node so that a source/drain path lies therebetween;
the first node is connected to gate electrodes of the third, fourth, fifth and sixth switching elements;
the third switching element is connected to the first operating potential point and the second node so that a source/drain path lies therebetween;
the fourth switching element is connected to the second operating potential point and the second node so that a source/drain path lies therebetween;
the fifth switching element is connected to the first operating potential point and the third node so that source/drain paths lie therebetween;
the sixth switching element is connected to the second operating potential point and the third node so that source/drain paths lie therebetween;
the second node is connected to an input pin of the second state holing circuit through the first logic gate group; and
the third node is connected to an input pin of the third state holing circuit through the second logic gate group,
wherein the first logic gate group is larger in number of logic gate stages than the second logic gate group, and
wherein at least one of a process condition and a bias voltage applied to a substrate or a well of the switching elements is a different, such that a threshold voltage of the fifth switching element is higher than a threshold voltage of each of the first and third switching elements, or a threshold voltage of the sixth switching element is higher than a threshold voltage of each of the second and fourth switching elements.

7. A semiconductor integrated circuit device having logic gates constructed of switching elements formed on a semiconductor substrate, which performs given processing by the logic gates on at least one input signal and outputs at least one signal, comprising:
at least first, second and third state holding circuits;
at least first, second, third, fourth, fifth, sixth, seventh and eighth switching elements;
a first operating potential point which a first operating potential is supplied and a second operating potential point which a second operating potential is supplied;
first, second and third nodes; and
first and second logic gate groups in each of which a plurality of logic gates are in series connected;
wherein an output pin of the first state holding circuit is connected to gate electrodes of the first and second switching elements through the first logic gate group;
the first switching element is connected to the first operating potential point and the first node so that a source/drain path lies therebetween;
the second switching element is connected to the second operating potential point and the first node so that a source/drain path lies therebetween;
an output pin of the second state holding circuit is connected to gate electrodes of the third and fourth switching elements through the first logic group;
the third switching element is connected to the first operating potential point and the second node so that a source/drain path lies therebetween;

the fourth switching element is connected to the second operating potential point and the second node so that a source/drain path lies therebetween;

the first node is connected to gate electrodes of the fifth and sixth switching elements;

the second node is connected to gate electrodes of the seventh and eighth switching elements;

the fifth and seventh switching elements are connected to the first operating potential point and the third node so that source/drain paths lies therebetween;

the sixth and eighth switching elements are connected to the second operating potential point and the third node so that source/drain paths lie therebetween; and the third node is connected to an input pin of the third state holing circuit or an output pin of the semiconductor integrated circuit directly or through at least one logic gate, wherein the first logic gate group is larger in number of logic gate stages than the second logic gate group, and wherein at least one of a process condition and a bias voltage applied to a substrate or a well of the switching elements is different, such that a threshold voltage of the third switching element is higher than a threshold voltage of each of the first and fifth switching elements or a threshold voltage of the seventh switching element, or a threshold voltage of the fourth switching element is higher than a threshold voltage of each of the second and sixth switching elements or a threshold voltage of the eighth switching element.

8. A semiconductor integrated circuit device according to claims 1 to 7, wherein the means for providing switching elements with different threshold voltages is to change an impurity density of a semiconductor substrate under a gate oxide film of a switching element.

9. A semiconductor integrated circuit device according to claims 1 to 7, wherein the means for providing switching elements with different threshold voltages is to change a bias voltage value supplied to a substrate or a well of a switching element.

10. A semiconductor integrated circuit device according to claims 1 to 7, wherein the means for providing switching elements with different threshold voltages is to change a thickness of a gate oxide film of a switching element.

11. A semiconductor integrated circuit device according to claims 1 to 7, wherein the means for providing switching elements with different threshold voltages is to change a gate length of a switching element.

12. A semiconductor integrated circuit device according to claims 1 to 7, wherein the means for providing switching elements with different threshold voltages is to combine two or more selected from the group consisting of first means to change an impurity density of a semiconductor substrate under a gate oxide film of a switching element; second means to change a bias voltage value supplied to a substrate or a well of a switching element; third means to change a thickness of a gate oxide film of a switching element; and fourth means to change a gate length of a switching element.

13. A semiconductor integrated circuit device according to claim 9, wherein logic gates are arranged one dimensionally in one line and a plurality of rows of logic gates are arranged in directions perpendicular to the one line so as to dispose logic gates two dimensionally, comprising substrate bias operating potential supply lines provided in parallel to the rows and in number equal to the number of kinds of threshold voltages of the switching elements in use.

14. A semiconductor integrated circuit device according to claim 9, comprising a plurality of well regions which are mutually insulated, wherein the switching elements with different threshold voltages are formed on different well regions.

15. A semiconductor integrated circuit device according to claim 9, wherein logic gates are arranged one dimensionally in one line and a plurality of rows of logic gates are arranged in directions perpendicular to the one line so as to dispose logic gates two dimensionally, and wherein logic gates which are constructed of switching elements with the same threshold voltage are arranged on one row; and the one row is disposed on one well region aligned along the one row; and there is provided with an operating potential supply line in parallel to a row in order to supply a substrate bias source.

16. A semiconductor integrated circuit device according to claim 15, wherein when logic gates on a plurality of rows adjacent one another are constructed of switching elements each with the same threshold voltage, the plurality of rows own commonly one well region among them.

\* \* \* \* \*